(12) United States Patent
Won et al.

(10) Patent No.: US 11,797,117 B2
(45) Date of Patent: Oct. 24, 2023

(54) DISPLAY DEVICE

(71) Applicant: SAMSUNG DISPLAY CO., LTD., Yongin-si (KR)

(72) Inventors: Byeong-Hee Won, Incheon (KR); Jun Hyeong Park, Seoul (KR); Ho-Sik Shin, Gunpo-si (KR); Jaemin Shin, Gyeonggi-Do (KR); Hyejin Joo, Gyeonggi-Do (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 68 days.

(21) Appl. No.: 17/614,292

(22) PCT Filed: Jul. 2, 2020

(86) PCT No.: PCT/KR2020/008672
§ 371 (c)(1),
(2) Date: Nov. 24, 2021

(87) PCT Pub. No.: WO2021/025299
PCT Pub. Date: Feb. 11, 2021

(65) Prior Publication Data
US 2022/0253169 A1    Aug. 11, 2022

(30) Foreign Application Priority Data

Aug. 7, 2019  (KR) .......................... 10-2019-0095931

(51) Int. Cl.
*G06F 3/041*   (2006.01)
*H10K 50/86*   (2023.01)
(Continued)

(52) U.S. Cl.
CPC ......... *G06F 3/0412* (2013.01); *H10K 50/865* (2023.02); *H10K 59/131* (2023.02);
(Continued)

(58) Field of Classification Search
None
See application file for complete search history.

(56) References Cited

U.S. PATENT DOCUMENTS 10,026,721 B2  7/2018  Kim et al.
10,121,844 B2  11/2018 Park et al.
(Continued)

FOREIGN PATENT DOCUMENTS

CN   108598125 A  * 9/2018 ............. G09F 9/301
CN   109935730 A  * 6/2019 ......... H01L 27/3276
(Continued)

OTHER PUBLICATIONS

Translation of CN-108598125-A into English; Gao et al. (Year: 2018).*
(Continued)

*Primary Examiner* — Brian M Butcher
(74) *Attorney, Agent, or Firm* — F. CHAU & ASSOCIATES, LLC

(57) ABSTRACT

A display device includes a display panel and an input sensing layer. The display panel includes a base layer including a first island part, a second island part, and a connection part. Sensing patterns of the input sensing layer include a first sensing line pattern disposed on both the first island part and the second island part, and a second sensing line pattern disposed on the connection part. The connection part is an area to which stress is applied as the display device is modified in shape. The second sensing line pattern is disposed on an area of the connection part to which relatively less stress is applied.

20 Claims, 21 Drawing Sheets

(51) Int. Cl.
    *H10K 59/38*     (2023.01)
    *H10K 59/40*     (2023.01)
    *H10K 59/131*     (2023.01)
    *H10K 77/10*     (2023.01)
    *G06F 3/044*     (2006.01)
    *H10K 102/00*     (2023.01)

(52) U.S. Cl.
    CPC ............. *H10K 59/38* (2023.02); *H10K 59/40* (2023.02); *H10K 77/111* (2023.02); *G06F 3/0446* (2019.05); *G06F 2203/04102* (2013.01); *H10K 2102/311* (2023.02)

(56) References Cited

U.S. PATENT DOCUMENTS

| | | | |
|---|---|---|---|
| 10,476,038 B2 | 11/2019 | Park et al. | |
| 10,714,544 B2 | 7/2020 | Kang et al. | |
| 10,763,312 B2 | 9/2020 | Jo et al. | |
| 10,825,873 B2 | 11/2020 | Oh et al. | |
| 10,978,544 B2 | 4/2021 | Shin et al. | |
| 2016/0268352 A1* | 9/2016 | Hong | H10K 59/88 |
| 2017/0005077 A1* | 1/2017 | Kim | G02B 6/0041 |
| 2017/0040306 A1* | 2/2017 | Kim | H05K 1/181 |
| 2017/0288168 A1* | 10/2017 | Kim | H10K 59/124 |
| 2019/0181214 A1* | 6/2019 | Lee | H10K 59/131 |
| 2020/0312248 A1 | 10/2020 | Shin et al. | |
| 2020/0350513 A1 | 11/2020 | Park et al. | |

FOREIGN PATENT DOCUMENTS

| | | | | |
|---|---|---|---|---|
| KR | 20170088013 | | 8/2017 | |
| KR | 20170110209 A | * | 10/2017 | ......... H01L 27/3258 |
| KR | 101834792 | | 3/2018 | |
| KR | 20180074944 | | 7/2018 | |
| KR | 20180074985 | | 7/2018 | |
| KR | 20190033118 | | 3/2019 | |
| KR | 101973163 | | 4/2019 | |
| KR | 10-2019-0052382 | | 5/2019 | |
| KR | 20200111866 | | 10/2020 | |
| KR | 20200115772 | | 10/2020 | |
| KR | 10-2020-0128309 | | 11/2020 | |

OTHER PUBLICATIONS

Translation of CN-109935730-A into English; Gu et al. (Year: 2019).*

Translation of KR-20170110209-A into English; Park et al. (Year: 2017).*

* cited by examiner

DISPLAY DEVICE

CROSS-REFERENCE TO RELATED APPLICATION

The present application is a National Stage application, filed under 35 U.S.C. § 371, of International Patent Application No. PCT/KR2020/008672, filed on Jul. 2, 2020, which claims priority to Korean Patent Application No. KR 10-2019-0095931, filed on Aug. 7, 2019, the contents of which are incorporated by reference herein in their entirety.

TECHNICAL FIELD

The present disclosure relates to a display device, and more particularly, to a stretchable display device capable of being modified in shape.

DISCUSSION OF THE RELATED ART

A display device displays various images on a display screen to provide information to a user. In general, a display device displays information within an assigned screen. Recently, flexible display devices including a flexible display panel having flexibility have been developed. Unlike a rigid display device, the flexible display device may be folded, rolled, bent, or stretched. The flexible display device, which is capable of being modified in various shape, may be portable regardless of a size of an existing screen and thus may be more convenient to a user. In addition, since the shape of the display device is easily modified, the display device may be easily installed on a mounting surface having various shapes regardless of a shape of the mounting surface.

SUMMARY

A display device includes a display panel configured to display an image and an input sensing layer including sensing patterns and connection patterns, wherein the display panel includes a base layer including a first island part, a second island part spaced apart from the first island part, and a connection part connecting the first island part to the second island part and having a shape extending in a first direction, a first pixel disposed on the first island part, a second pixel disposed on the second island part, signal lines disposed on the connection part and electrically connected to the first pixel and the second pixel, a first cover part covering the first pixel, a second cover part covering the second pixel, and a connection cover part disposed on the signal lines, wherein each of the sensing patterns includes a first sensing line pattern disposed on the first cover part and the second cover part and a second sensing line pattern disposed on the connection cover part, and the connection part includes a first area and a second area, each of which has a shape extending in the first direction and which are adjacent to each other in a second direction crossing the first direction, wherein the first area is spaced apart from the first island part and the second island part with the second area therebetween, and the second sensing line pattern is disposed on the first area.

Each of the first cover part and the second cover part may include a first inorganic layer, an organic layer disposed on the first inorganic layer, and a second inorganic layer covering the organic layer, wherein the first sensing line pattern may be disposed on the second inorganic layer.

Each of the first cover part and the second cover part may further includes a light blocking layer disposed between the second inorganic layer and the first sensing line pattern.

The connection cover part may include a first connection inorganic layer extending from the first inorganic layer and a second connection inorganic layer extending from the second inorganic layer and disposed on the first connection inorganic layer.

The connection cover part may further include a connection light blocking layer disposed on the second connection inorganic layer and extending from the light blocking layer.

Each of the first cover part and the second cover part may further include a first color filter layer disposed on the second inorganic layer, a second color filter layer disposed on the second inorganic layer and adjacent to the first color filter layer, and a third color filter layer disposed on the second inorganic layer and adjacent to the second color filter layer, wherein the first sensing line pattern may be disposed on the first color filter layer, the second color filter layer, and the third color filter layer.

The connection cover part may include a first compensation layer including a same material as the first color filter layer, a second compensation layer including a same material as the second color filter layer, and a third compensation layer comprising a same material as the third color filter layer, wherein the second sensing line pattern may be disposed on the third compensation layer.

The connection cover part may further include a light blocking layer disposed between the third compensation layer and the second sensing line pattern.

Each of the first cover part and the second cover part may further include a light blocking layer disposed between the first sensing line pattern and the first to third color filter layers, wherein openings may be defined in the light blocking layer.

Each of the first cover part and the second cover part may further include a light blocking layer covering the first sensing line pattern.

Each of the first cover part and the second cover part may include a first inorganic layer, a second inorganic layer directly disposed on the first inorganic layer, a first color filter layer disposed on the second inorganic layer, a second color filter layer disposed on the second inorganic layer and adjacent to the first color filter layer, and a third color filter layer disposed on the second inorganic layer and adjacent to the second color filter layer, wherein the first sensing line pattern may be disposed on the first color filter layer, the second color filter layer, and the third color filter layer.

Each of the first cover part and the second cover part may further include a light blocking layer disposed between the first sensing line pattern and the first to third color filter layers.

Each of the first cover part and the second cover part may further include a light blocking layer covering the first sensing line pattern.

Each of the first cover part and the second cover part may include a first inorganic layer, a first organic layer disposed on the first inorganic layer, a second inorganic layer disposed on the first organic layer, a second organic layer disposed on the second inorganic layer, and a third inorganic layer covering the second organic layer, wherein the first sensing line pattern may be disposed on the third inorganic layer.

The second sensing line pattern may include a first sub sensing layer connected to the first sensing line pattern and a second sub sensing layer disposed on a different layer from the first sub sensing layer, wherein the first sub sensing layer and the second sub sensing layer may be electrically connected to each other.

The sensing patterns may include first sensing patterns and second sensing patterns, the connection patterns may include a first connection pattern connected to the first sensing patterns adjacent to each other and a second connection pattern connected to the second sensing patterns adjacent to each other, and the input sensing layer may further include a sensing insulating layer disposed between the first connection pattern and the second connection pattern.

The first sub sensing layer may include a same material as the first connection pattern, the second sub sensing layer may include a same material as the second connection pattern, and the sensing insulating layer may extend to an area between the first sub sensing layer and the second sub sensing layer.

The input sensing layer may further include a light absorption layer disposed on at least a portion of the sensing patterns and the connection patterns.

A display device includes a display panel configured to display an image and an input sensing layer including sensing patterns and connection patterns, wherein the display panel includes a base layer including a first island part, a second island part, and a connection part connecting the first island part to the second island part, a first pixel disposed on the first island part, a second pixel disposed on the second island part, signal lines disposed on the connection part and electrically connected to the first pixel and the second pixel, a first cover part disposed on the first pixel and covering the first pixel, a second cover part disposed on the second pixel and covering the second pixel, and a connection cover part disposed on the signal lines, wherein each of the sensing patterns includes a first sensing line pattern disposed on the first cover part and the second cover part and a second sensing line pattern disposed on the connection cover part and connected to the first sensing line pattern, each of the first cover part and the second cover part includes a color filter layer, the connection cover part includes a compensation layer, and the compensation layer includes a same material as the color filter layer.

The connection part may have a shape extending from the first island part to the second island part in a first direction, the connection part may include a first area and a second area, each of which has a shape extending in the first direction, the first area may be spaced apart from the first island part and the second island part with the second area therebetween in a second direction crossing the first direction, and the second sensing line pattern may overlap the first area on a plane and is spaced apart from the second area.

DETAILED DESCRIPTION OF THE DRAWINGS

Figure 1A:
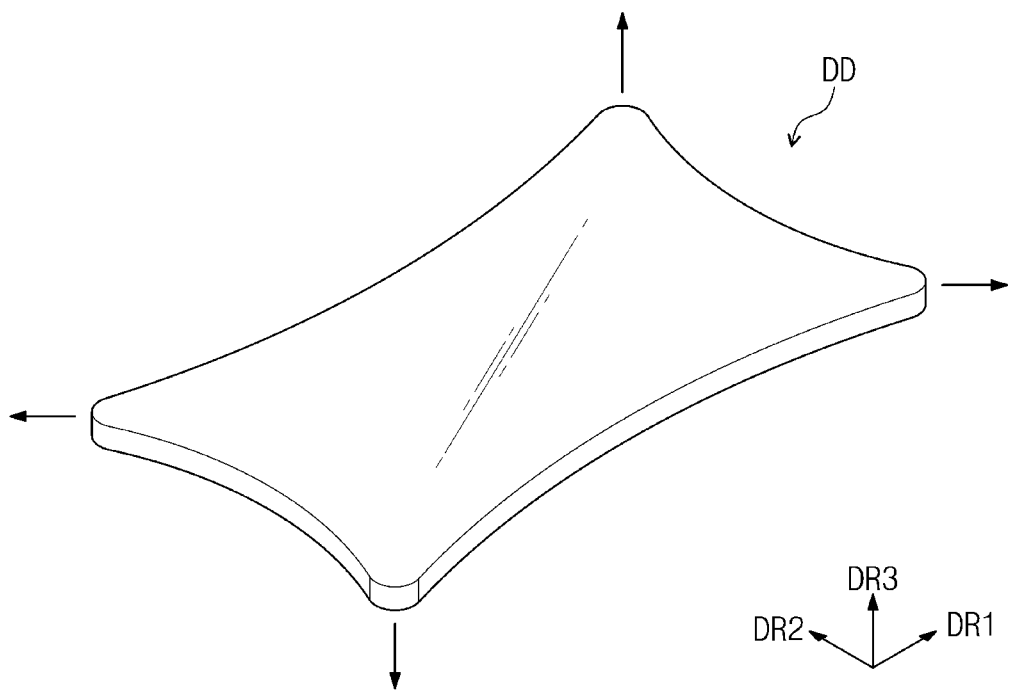
FIG. 1a is a perspective view of a display device according to an embodiment of the prevent disclosure.

According to an embodiment of the present disclosure, in a stretchable display device, an input sensing layer may be disposed directly on the display panel. The distance between the input sensing layer and the cathode may be greater than or equal to a predetermined distance by the cover part. Thus, the touch sensitivity and accuracy of the input sensing layer may be increased.

In addition, according to an embodiment of the present disclosure, the sensing line pattern of the input sensing layer disposed on the connection part, which connects the island parts to each other, may be adjusted in position to reduce the stress applied to the sensing line pattern. In addition, since the sensing line pattern is provided to have the laminated structure including the plurality of conductive layers, the possibility that the sensing line pattern is disconnected may be reduced.

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals may refer to like elements throughout the specification and figures. Also, in the figures, the thickness, ratio, and dimensions of components may be exaggerated for clarity of illustration.

The term "and/or" includes any and all combinations of one or more of the associated listed items.

It will be understood that although the terms such as 'first' and 'second' are used herein to describe various elements, these elements should not necessarily be limited by these terms. The terms are only used to distinguish one component from other components. For example, a first element may be referred to as a second element, and similarly a second element may be referred to as a first element, without departing from the scope of the present disclosure. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this disclosure belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the present disclosure will be described with reference to the accompanying drawings.

Figure 1B:
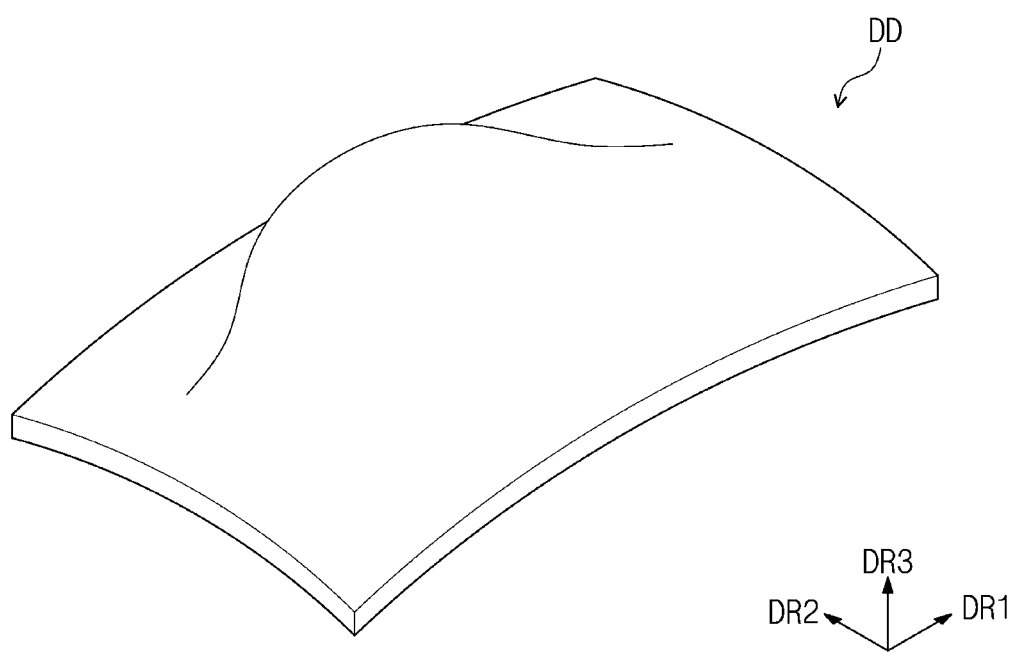
FIG. 1b is a perspective view of a display device according to an embodiment of the present disclosure.

FIG. 1a is a perspective view of a display device according to an embodiment of the present disclosure. FIG. 1b is a perspective view of a display device according to an embodiment of the present disclosure.

Referring to FIGS. 1A and 1B, a display device DD may be a stretchable display device. In this case, a shape of the display device DD may be variously modified. For example, the display device DD may extend in various directions.

As illustrated in FIG. 1A, the display device DD may extend in various directions on a plane defined by a first direction DR1 and a second direction DR2. The shape modification of the display device DD may be performed by externally applied force.

As illustrated in FIG. 1B, the display device DD may extend in a direction protruding from the display surface. For example, the display device DD may extend in a direction protruding from a plane defined by the first direction DR1 and the second direction DR2.

According to an embodiment of the present disclosure, since the shape of the display device DD is easily modified, the display device DD may be installed on a mounting surface having various shapes. For example, the display device DD may be installed on an outer wall or an inner wall of a building having a curve. Also, the display device DD may be installed on a curved mounting surface inside a vehicle.

Figure 2:
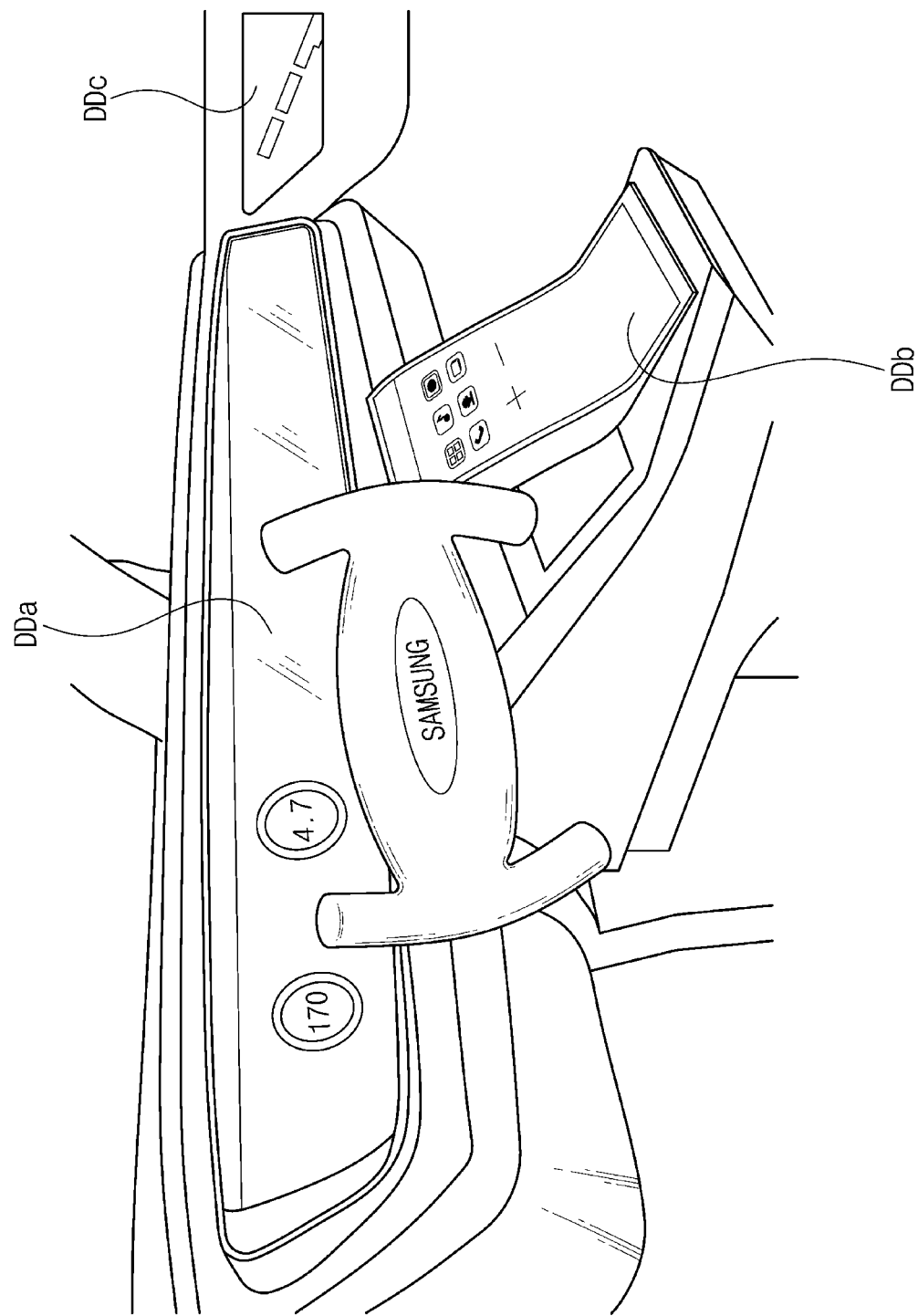
FIG. 2 is a view illustrating environments in which the display device is used according to an embodiment of the present disclosure.

FIG. 2 is a view illustrating environments in which the display device is used according to an embodiment of the present disclosure.

Referring to FIG. 2, display devices DDa, DDb, and DDc may be stretchable display devices. The display devices DDa, DDb, and DDc may be mounted inside a vehicle. For example, the display devices DDa, DDb, and DDc include a display device DDa for displaying various types of information required for driving the vehicle, a display device DDb for manipulating various systems such as an air conditioner, a heater, an audio, and an air circulation, and a display device DDc for displaying a rear image.

The mounting surface of the vehicle on which the display devices DDa, DDb, and DDc are installed may have a curved surface. According to an embodiment of the present disclosure, each of the shapes of the display devices DDa, DDb, and DDc may be modified to correspond to the shape of the curved mounting surface. Thus, the display devices DDa, DDb, and DDc may be easily installed on the mounting surfaces having various shapes.

Figure 3:
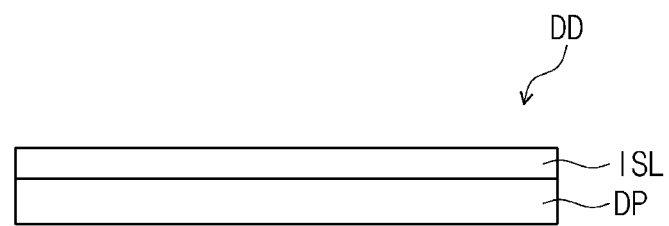
FIG. 3 is a schematic cross-sectional view of the display device according to an embodiment of the present disclosure.
Figure 3:
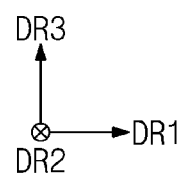

FIG. 3 is a schematic cross-sectional view of the display device according to an embodiment of the present disclosure.

Referring to FIG. 3, the display device DD may include a display panel DP and an input sensing layer ISL.

The display panel DP may display an image. The display panel DP may be an emissive display panel, but is not particularly limited. For example, the display panel DP may be an organic light emitting display panel, a quantum dot light emitting display panel, a micro LED display panel, or a nano LED display panel. The organic light emitting display panel may include an organic light emitting material. An emission layer of the quantum dot light emitting display panel may include a quantum dot and/or a quantum rod. An emission layer of the micro LED display panel may include a micro-sized LED. An emission layer of the nano LED display panel may include a nano-sized LED.

The input sensing layer ISL may acquire coordinate information of an external input (e.g., a touch event). The input sensing layer ISL may sense an external input in a mutual cap manner or a self-cap manner. Alternatively, the input sensing layer ISL may sense the external input in the mutual cap manner and the self-cap manner.

Figure 4:
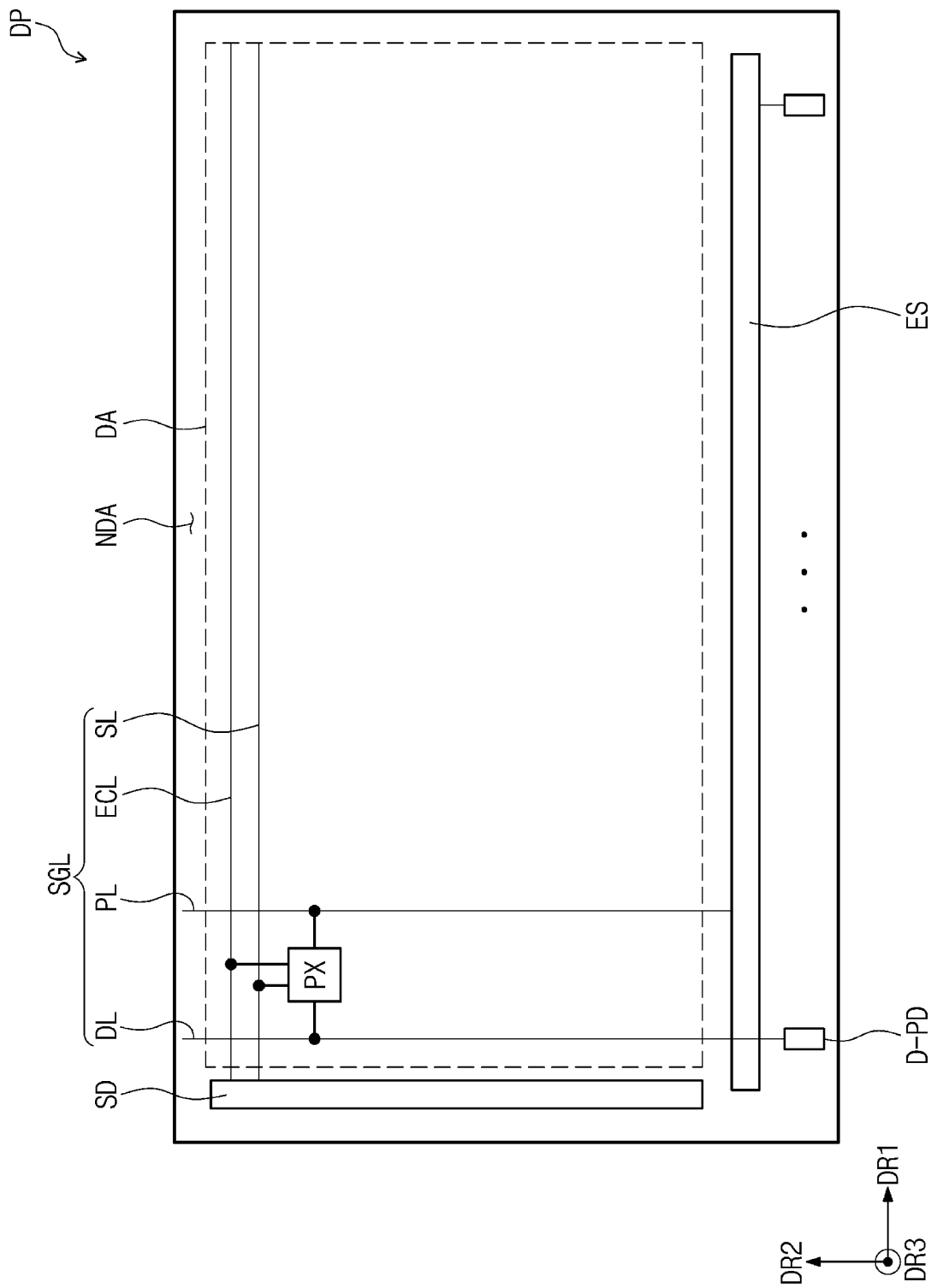
FIG. 4 is a plan view of the display panel according to an embodiment of the present disclosure.

FIG. 4 is a plan view of the display panel according to an embodiment of the present disclosure.

Referring to FIG. 4, the display panel DP may include a display area DA and a non-display area NDA on the plane. In this embodiment, the non-display area NDA may be defined along an edge of the display area DA.

The display panel DP may include a driving circuit SD, signal lines SGL, display pads D-PD, and pixels PX. The signal lines SGL may include scan lines SL, emission control lines ECL, data lines DL, and power lines PL. In FIG. 4, only one scan line SL, one emission control line ECL, one data line DL, and one power line PL are illustrated.

The driving circuit SD may be disposed on the non-display area NDA. The driving circuit SD may be electrically connected to the scan lines SL and the emission control lines ECL. The driving circuit SD may include, for example, a first driving circuit connected to the scan lines SL and a second driving circuit connected to the emission control lines ECL. The first driving circuit may generate a scan signal to output the scan signal to the scan lines SL. The second driving circuit may generate an emission control signal to output the emission control signal to the emission control lines ECL.

The data lines DL may be electrically connected to the display pads D-PD disposed on the non-display area NDA. The display panel DP may further include a data driving circuit coupled to the display pads D-PD in the form of a chip on film (COF) or a chip on plastic (COP). However, this is merely an example, and in another embodiment of the present disclosure, the data driving circuit may be integrated on the non-display area NDA.

The power electrode ES may be disposed on the non-display area NDA. The power electrode ES may have a shape extending in the first direction DR1. The power lines PL may be connected to the power electrode ES to provide a power signal to the pixel PX.

Figure 5:
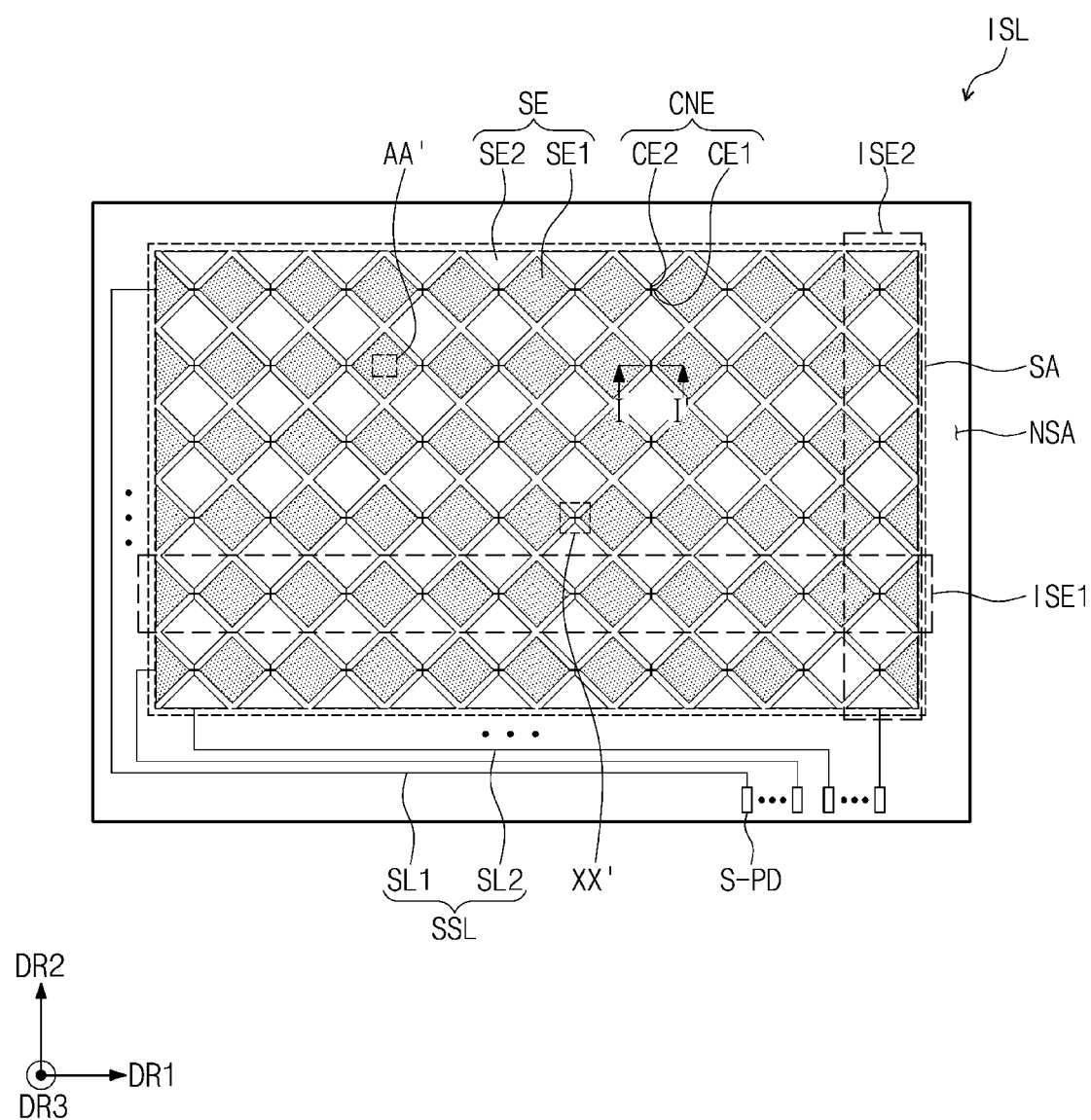
FIG. 5 is a plan view of an input sensing layer according to an embodiment of the present disclosure.

FIG. 5 is a plan view of the input sensing layer according to an embodiment of the present disclosure.

Referring to FIG. 5, the input sensing layer ISL may include a sensing area SA and a non-sensing area NSA on the plane. In this embodiment, the non-sensing area NSA may be defined along an edge of the sensing area SA. The sensing area SA may correspond to the display area DA (see FIG. 4), and the non-sensing area NSA may correspond to the non-display area NDA (see FIG. 4).

The input sensing layer ISL may include sensing patterns SE, connection patterns CNE, sensing lines SSL, and sensing pads S-PD. The sensing patterns SE and the connection patterns CNE may be disposed on the sensing area SA, and the sensing lines SSL and the sensing pads S-PD may be disposed on the non-sensing area NSA.

The sensing patterns SE may include first sensing patterns SE1 and second sensing patterns SE2. In FIG. 5, the first sensing patterns SE1 are displayed darker than the second sensing patterns SE2 for clarity. The connection patterns CNE may include first connection patterns CE1 and second connection patterns CE2. The sensing lines SSL may include first sensing lines SL1 and second sensing lines SL2.

The first sensing patterns SE1 may be arranged in the first direction DR1. Each of the first connection patterns CE1 may be connected to two first sensing patterns SE1 adjacent to each other in the first direction DR1. The second sensing patterns SE2 may be arranged in the second direction DR2. Each of the second connection patterns CE2 may be connected to two second sensing patterns SE2 adjacent to each other in the second direction DR2. One first connection pattern CE1 and one second connection pattern CE2 may be insulated from each other and cross each other.

The first sensing patterns SE1 and the first connection patterns CE1 arranged in the first direction DR1 may constitute a first sensing electrode ISE1. The second sensing patterns SE2 and the second connection patterns CE2 arranged in the second direction DR2 may constitute a second sensing electrode ISE2. Each of the first sensing electrode ISE1 and the second sensing electrode ISE2 may be provided in plurality. Each of the first sensing electrodes ISE1 may extend in the first direction DR1 and may be arranged in the second direction DR2. Each of the second sensing electrodes ISE2 may extend in the second direction DR2 and may be arranged in the first direction DR1.

The first sensing lines SL1 may be connected to the first sensing electrodes ISE1 to one-to-one correspond to each other, respectively, and the second sensing lines SL2 may be connected to the second sensing electrodes ISE2 to one-to-one correspond to each other, respectively. Also, the first sensing lines SL1 and the second sensing lines SL2 may be electrically connected to the sensing pads S-PD.

Figure 6A:
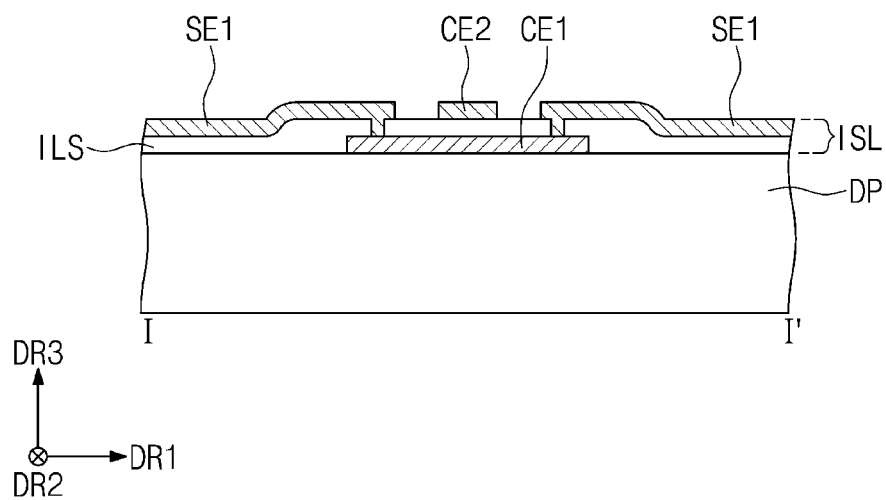
FIG. 6A is a cross-sectional view taken along line I-I' of FIG. 5.

FIG. 6A is a cross-sectional view taken along line I-I' of FIG. 5.

Referring to FIG. 6A, the input sensing layer ISL may be directly disposed on the display panel DP. That is, the fact that the input sensing layer ISL is directly disposed on the display panel DP may mean that a separate adhesive layer/adhesive member for bonding the input sensing layer ISL to the display panel DP is not disposed. In other words, the fact may mean that the input sensing layer ISL is formed on a base surface provided by the display panel DP through a continuous process.

The input sensing layer ISL may further include a sensing insulating layer ILS disposed between the first connection pattern CE1 and the second connection pattern CE2. For example, the first connection pattern CE1 may be disposed on the display panel DP, and the sensing insulating layer ILS may cover the first connection pattern CE1. The second connection pattern CE2 may be disposed on the first connection pattern CE1 and may be spaced apart from the first connection pattern CE1 and the second connection pattern CE2 by the sensing insulating layer ILS. The first sensing patterns SE1 and the second sensing patterns SE2 (see FIG. 5) may be disposed on the sensing insulating layer ILS.

In an embodiment of the present disclosure, the sensing insulating layer ILS may be provided as an island-shaped pattern. For example, the sensing insulating layer ILS may be provided on only one area on which the first connection pattern CE1 and the second connection pattern CE2 cross each other. In this case, the first connection pattern CE1, the first sensing patterns SE1, and the second sensing patterns SE2 (see FIG. 5) may be directly disposed on the display panel DP.

Each of the first connection pattern CE1, the second connection pattern CE2, the first sensing patterns SE1, and the second sensing patterns SE2 (see FIG. 5) may include a metal material. For example, the first connection pattern CE1, the second connection pattern CE2, the first sensing patterns SE1, and the second sensing patterns SE2 (see FIG. 5) may include silver or copper.

Figure 6B:
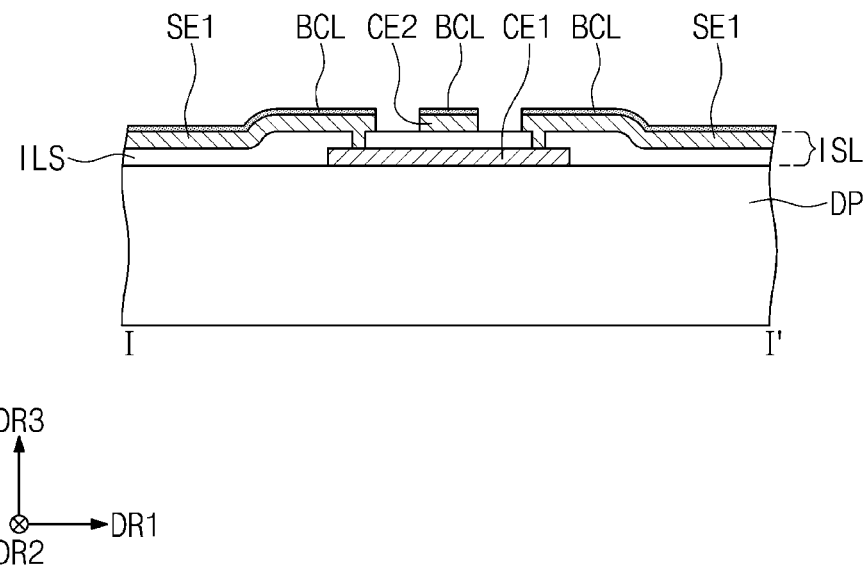
FIG. 6B is a cross-sectional view taken long line I-I' of FIG. 5.

FIG. 6B is a cross-sectional view taken long line I-I' of FIG. 5.

Referring to FIG. 6b, a light absorption layer BCL may be further disposed on the second connection pattern CE2, the first sensing patterns SE1, and the second sensing patterns SE2 (see FIG. 5). The light absorption layer BCL may include a black nickel plating layer or a black chrome plating layer, but the material constituting the light absorption layer BCL is not limited thereto.

Reflectivity of light incident from the outside may be reduced by the light absorption layer BCL. Thus, display quality of the display device DD (see FIG. 1A) may be further improved. Although the light absorption layer BCL is not illustrated in the embodiments to be described below, the light absorption layer BCL may be additionally applied.

Figure 6C:
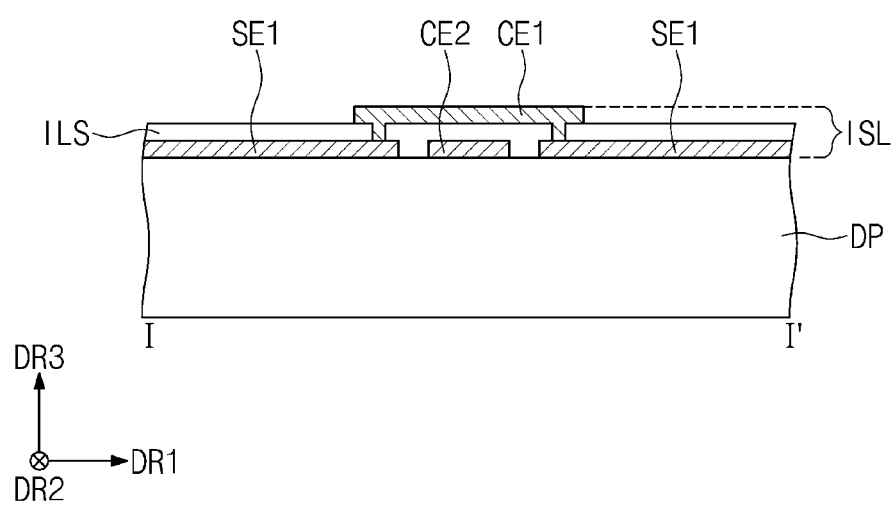
FIG. 6C is a cross-sectional view taken long line I-I' of FIG. 5.

FIG. 6C is a cross-sectional view taken long line I-I' of FIG. 5.

Referring to FIG. 6C, the first sensing patterns SE1 and the second sensing patterns SE2 (see FIG. 5) may be disposed under the sensing insulating layer ILS. In this case, the second connection pattern CE2, the first sensing patterns SE1, and the second sensing patterns SE2 (see FIG. 5) may be directly disposed on the display panel DP, and the first connection pattern CE1 may be disposed on the sensing insulating layer ISL. Also, the first sensing patterns SE1 may be electrically connected to the first connection pattern CE1 through a contact hole passing through the sensing insulating layer ILS.

Figure 7:
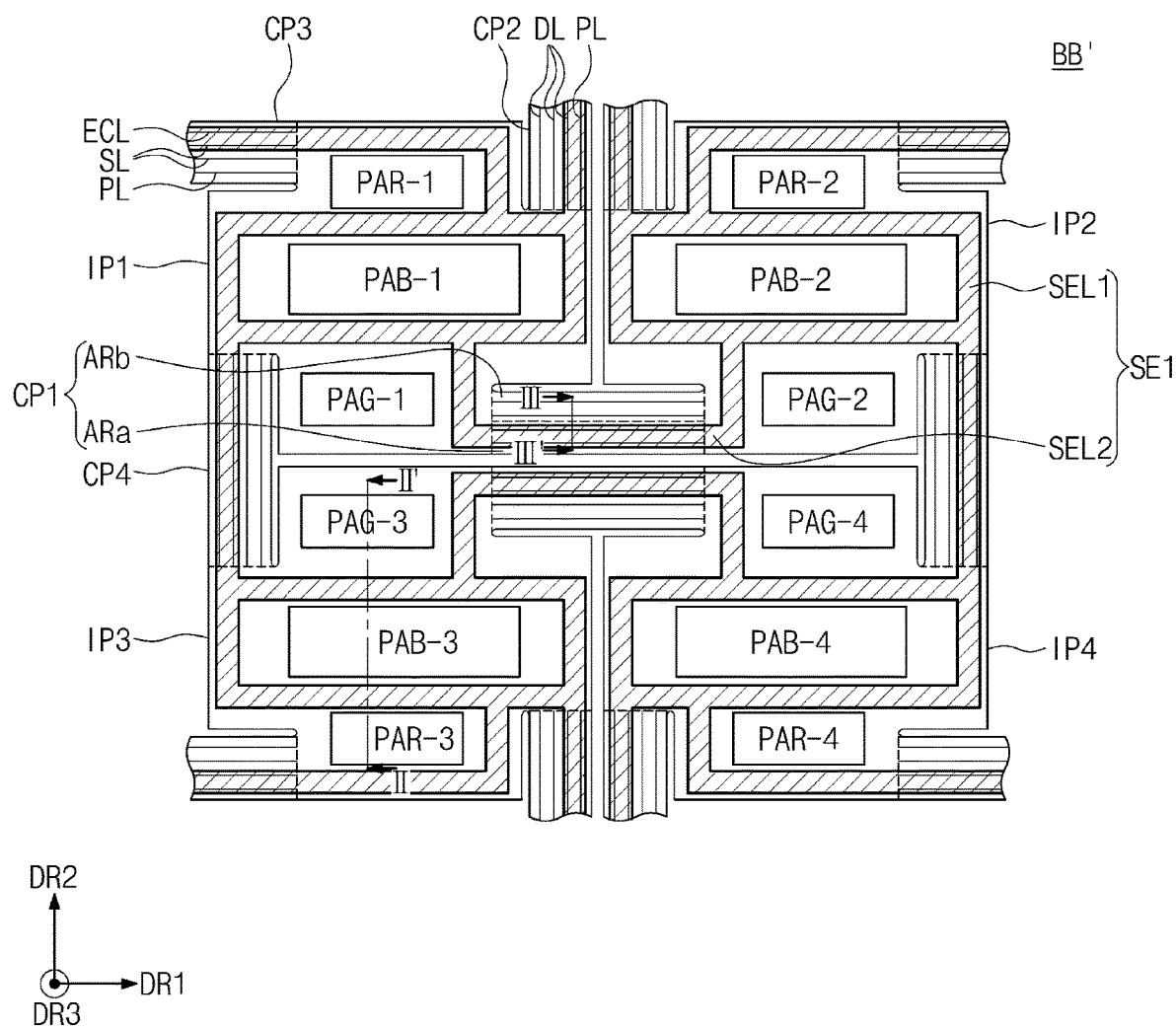
FIG. 7 is an enlarged plan view illustrating a portion of the display panel according to an embodiment of the present disclosure.
Figure 8:
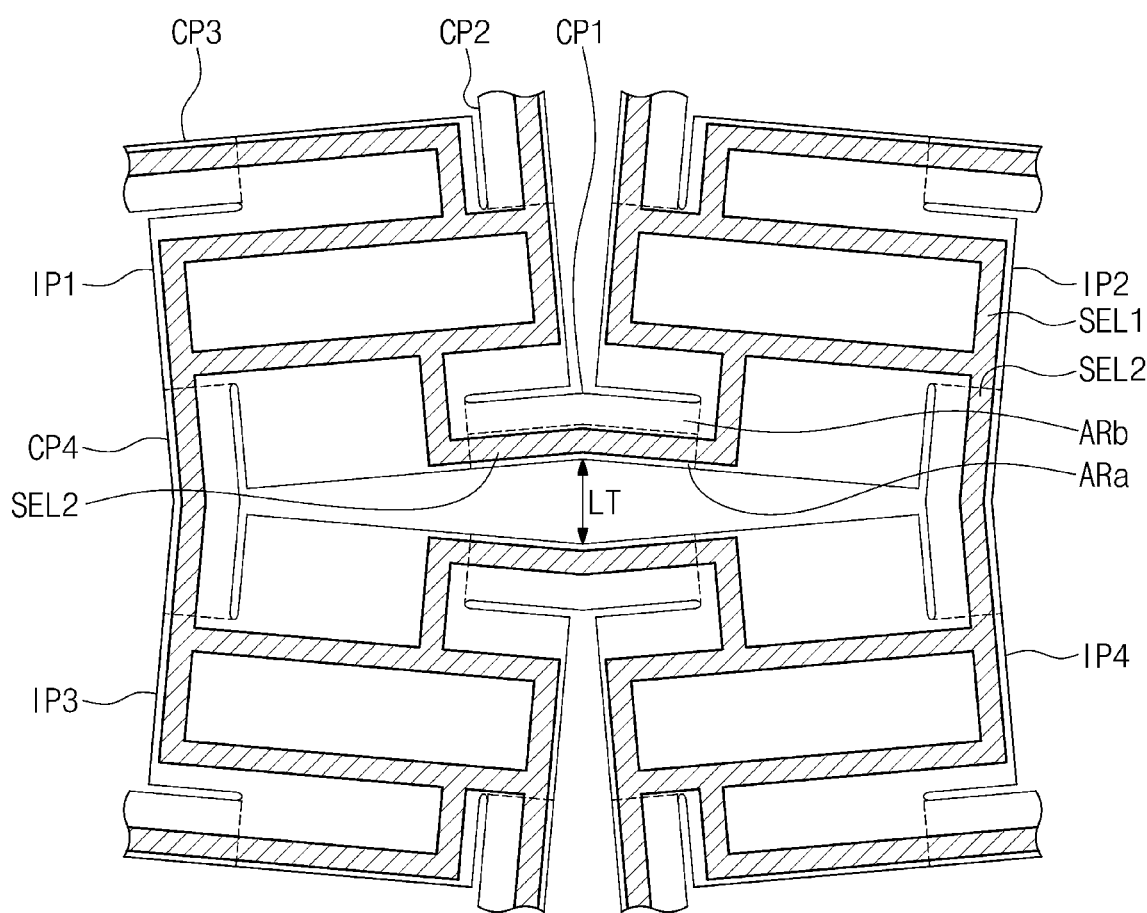
FIG. 8 is a plan view illustrating a portion of a configuration of the display panel according to an embodiment of the present disclosure.

FIG. 7 is an enlarged plan view illustrating a portion of the display panel according to an embodiment of the present disclosure. FIG. 8 is a plan view illustrating a portion of a configuration of the display panel according to an embodiment of the present disclosure.

Referring to FIGS. 7 and 8, the display panel DP may include a base layer BL.

The base layer BL may include island parts IP1, IP2, IP3, and IP4 and connection parts CP1, CP2, CP3, and CP4 respectively extending from the island parts IP1, IP2, IP3, and IP4. The island parts IP1, IP2, IP3, and IP4 may be referred to as island portions IP1, IP2, IP3, and IP4. The connection parts CP1, CP2, CP3, and CP4 may be referred to as connection portions CP1, CP2, CP3, and CP4.

FIG. 7 exemplarily illustrates four island parts IP1, IP2, IP3, and IP4 among the island parts IP1, IP2, IP3, and IP4. The first island part IP1 may be spaced apart from the second island part IP2 in the first direction DR1, the third island part IP3 may be spaced apart from the first island part IP1 in the second direction DR2, and the fourth island part IP4 may be spaced apart from the second island part IP2 in the second direction DR2.

The connection parts CP1, CP2, CP3, and CP4 may extend from each of the first to fourth island parts IP1, IP2, IP3, and IP4. Hereinafter, the description will be made based on the first island part IP1.

The connection parts CP1, CP2, CP3, and CP4 may include a first connection part CP1, a second connection part CP2, a third connection part CP3, and a fourth connection part CP4. The first connection part CP1 may extend from the first island part IP1 in the first direction DR1. The first connection part CP1 may connect the first island part IP1 to the second island part IP2. The second connection part CP2 may extend from the first island part IP1 in the second direction DR2. The second connection part CP2 may be connected to an island part (not shown) disposed on the first island part IP1. The third connection part CP3 may extend from the first island part IP1 in the first direction DR1. The third connection part CP3 may be connected to an island part (not shown) disposed at a left side of the first island part IP1. The fourth connection part CP4 may extend from the first island part IP1 in the second direction DR2. The fourth connection part CP4 may be connected to the third island part IP3.

First pixels PAR-1, PAB-1, and PAG-1 may be disposed on the first island part IP1, second pixels PAR-2, PAB-2, and PAG-2 may be disposed on the second island part IP2, third pixels PAR-3, PAB-3, and PAG-3 may be disposed on the third island part IP3, and fourth pixels PAR-4, PAB-4, and PAG-4 may be disposed on the fourth island part IP4.

A first cover part may be disposed on the first pixels PAR-1, PAB-1, and PAG-1, a second cover part may be disposed on the second pixels PAR-2, PAB-2, and PAG-2, a third cover part may be disposed on the third pixels PAR-3, PAB-3, and PAG-3, and a fourth cover part may be disposed on the fourth pixels PAR-4, PAB-4, and PAG-4. The description of the first to fourth cover parts will be described in detail below.

The signal lines DL, PL, SL, and ECL may be disposed on the first to fourth connection parts CP1, CP2, CP3, and CP4. For example, the scan line SL, the emission control line ECL, and the power line PL may be disposed on the first and third connection parts CP1 and CP3, each of which has a shape extending in the first direction DR1, and the data line DL and the power line PL may be disposed on the second connection part CP2 and the fourth connection part CP4, each of which has a shape extending in the second direction DR2. However, this is merely an example, and the arrangement relationship of the signal lines may be changed according to a pixel design.

A first connection cover part may be disposed on the first connection part CP1, a second connection cover part may be disposed on the second connection part CP2, a third connection cover part may be disposed on the third connection part CP3, and a fourth connection cover part may be disposed on the fourth connection part CP4. The description of the first to fourth connection cover parts will be described in detail below.

An area BB' illustrated in FIG. 7 may overlap an area AA' illustrated in FIG. 5. Each of the sensing patterns SE1 and SE2 may overlap several tens of island parts. For example, one first sensing pattern SE1 may overlap several tens of island parts arranged in a rhombus shape on the plane. Thus, the first to fourth island parts IP1, IP2, IP3, and IP4 illustrated in FIG. 7 may overlap one first sensing pattern SE1.

The first sensing pattern SE1 may include a first sensing line pattern SEL1 and a second sensing line pattern SEL2. The first sensing line pattern SEL1 may be disposed on the first to fourth cover parts, and the second sensing line pattern SEL2 may be disposed on the first to fourth connection cover parts. That is, on the plane, the first sensing line pattern SEL1 may overlap the first to fourth island parts IP1, IP2, IP3, and IP4, and the second sensing line pattern SEL2 may overlap the first to fourth connection parts CP1, CP2, CP3, and CP4.

On the plane, the second sensing line pattern SEL2 may be disposed to be spaced apart from the first to fourth island parts IP1, IP2, IP3, and IP4. The description will be made based on the first connection part CP1. The first connection part CP1 may have a shape extending in the first direction DR1. For example, the first connection part CP1 may be disposed from the first island part IP1 in the first direction DR1. Also, the first connection part CP1 may connect the first island part IP1 to the second island part IP2 in the first direction DR1.

The first connection part CP1 may include a first area ARa and a second area ARb, each of which has a shape extending in the first direction DR1. For example, a length of the first connection part CP1 in the first direction DR1 may be greater than that of the first connection part CP1 in the second direction DR2.

The first area ARa and the second area ARb may be adjacent to each other in the second direction DR2. On the plane, the second area ARb may be defined between the first area ARa and the first island part IP1 and between the first area ARa and the second island part IP2. For example, the first island part IP1 and the first area ARa may be spaced apart from each other in the second direction DR2, and the second area ARb may be defined between the first island part IP1 and the first area ARa. Also, the second island part IP2 and the first area ARa may be spaced apart from each other in the second direction DR2, and the second area ARb may be defined between the second island part IP2 and the first area ARa. On the plane, the second sensing line pattern SEL2 may overlap the first area ARa and may not overlap the second area ARb.

In FIG. 8, only the base layer BL and the first sensing pattern SE1 are illustrated. When force is applied to the display panel DP to modify the shape of the display panel DP, each of the island parts IP1, IP2, IP3, and IP4 may rotate in a predetermined direction, and thus, a distance LT between the adjacent connection parts may increase. Here, tensile stress may be applied to the second areas ARb of each of the first to fourth connection parts CP1, CP2, CP3, and CP4. According to an embodiment of the present disclosure, the second sensing line pattern SEL2 is disposed on the first area ARa that undergoes relatively less tensile stress. Thus, even if the shape of the display device DD (see FIG. 1a) is modified, possibility that the second sensing line pattern SEL2 is disconnected, or the second sensing line pattern SEL2 is cracked may be reduced.

Although it has been described above based on the case in which the first connection part CP1 is divided into the first area ARa and the second area ARb for convenience of description, the first area ARa and the second area ARb are not physically separated from each other. That is, the first area ARa and the second area ARb are not physically separated components, and the first area ARa and the second area ARb may be provided integrally.

Figure 9:
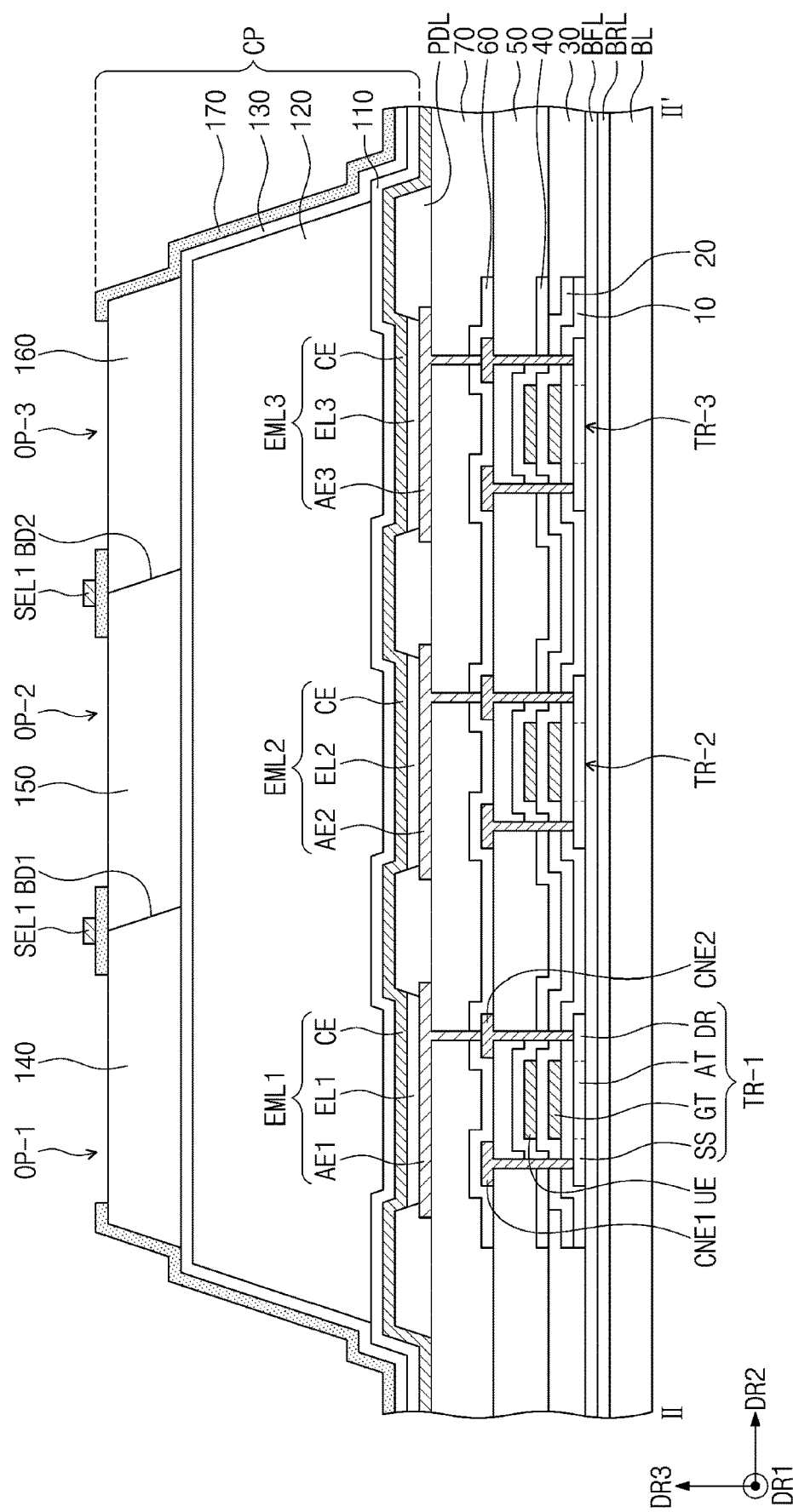
FIG. 9 is a cross-sectional view taken along line II-II' of FIG. 7.

FIG. 9 is a cross-sectional view taken along line II-II' of FIG. 7. FIG. 9 illustrates a cross-sectional view of the third island part IP3. The first island part IP1, the second island part IP2, and the fourth island part IP4 may also be understood with reference to the description below.

Referring to FIGS. 7 and 9, the base layer BL may include a synthetic resin film. The synthetic resin layer may include a thermosetting resin. Particularly, the synthetic resin layer may be a polyimide resin layer, and the material thereof is not particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. The base layer BL may be provided as a single layer or a plurality of layers.

At least one inorganic layer is disposed on a top surface of the base layer BL. The inorganic layer may include at least one of oxide, titanium oxide, silicon oxide, silicon oxynitride, zirconium oxide, or hafnium oxide. The inorganic layer may be provided as a multilayer. The multilayered inorganic layers may constitute a barrier layer BRL and/or a buffer layer BFL, which will be described below. The barrier layer BRL and the buffer layer BFL may be selectively disposed.

The barrier layer BRL prevents foreign substances from being introduced from the outside. The barrier layer BRL may include a silicon oxide layer and a silicon nitride layer. The above-described layers may be provided in plurality, and silicon oxide layers and silicon nitride layers may be alternately laminated.

The buffer layer BFL may be disposed on the barrier layer BRL. The buffer layer BFL improves bonding force between the base layer BL and the semiconductor pattern and/or the conductive pattern. The buffer layer BFL may include a silicon oxide layer and a silicon nitride layer. The silicon oxide layer and the silicon nitride layer may be alternately laminated.

The first pixel PAR-3, the second pixel PAB-3, and the third pixel PAG-3 may be disposed on the buffer layer BFL. The first pixel PAR-3 may include a first pixel circuit and a first light emitting element EML1 electrically connected to the first pixel circuit. The second pixel PAB-3 may include a second pixel circuit and a second light emitting element EML2 electrically connected to the second pixel circuit. The third pixel PAG-3 may include a third pixel circuit and a third light emitting element EML3 electrically connected to the third pixel circuit. Each of the first pixel circuit, the second pixel circuit, and the third pixel circuit may include at least one transistor and at least one capacitor. Hereinafter, FIG. 9 illustrates a cross-sectional view of a partial configuration of each of the first pixel circuit, the second pixel circuit, and the third pixel circuit.

A first transistor TR-1 of the first pixel circuit may include an active AA, a source SS, a drain DR, and a gate GT. A description of a second transistor TR-2 of the second pixel circuit and a third transistor TR-3 of the third pixel circuit will be omitted.

Semiconductor patterns SS, AA, and DD are disposed on the buffer layer BFL. Hereinafter, the semiconductor patterns SS, AA, and DD directly disposed on the buffer layer BFL may include a silicon semiconductor, a polysilicon semiconductor, or an amorphous silicon semiconductor. The semiconductor patterns SS, AA, and DD have different electrical properties depending on whether the semiconductor patterns are doped. The semiconductor pattern may include a doped region and a non-doped region. The doped region may be doped with an N-type dopant or a P-type dopant. A P-type transistor includes a doped region into which the P-type dopant is doped.

The doped region may have conductivity greater than that of the non-doped region and may substantially act as an electrode or a signal line. The non-doped region may substantially correspond to an active (or a channel) of the transistor. In other words, a portion of the semiconductor patterns SS, AA, and DD may be the active AA of the first transistor TR-1, the other portion may be the source SS or the drain DR of the first transistor TR-1, and another portion may be a connection signal line (or a connection electrode).

The first insulating layer 10 is disposed on the buffer layer BFL to cover the semiconductor patterns SS, AA, and DD. The first insulating layer 10 may include an inorganic layer and/or an organic layer and have a single-layered or multi-layered structure. The first insulation layer 10 may include at least one of aluminum oxide, titanium oxide, silicon oxide, silicon oxide nitride, zirconium oxide, or hafnium oxide. In this embodiment, the first insulating layer 10 may be a single-layered silicon oxide layer. The inorganic layer may include at least one of the above-described materials.

The gate GT may be disposed on the first insulating layer 10. The gate GT may be a portion of a metal pattern. On the plane, the gate GT may overlap the active AA. In the process of doping the semiconductor pattern, the gate GT may function as a mask.

The second insulating layer 20 is disposed on the first insulating layer 10 to cover the gate GT. The second insulating layer 20 may be an inorganic layer and/or an organic layer and have a single-layered or multilayered structure. In this embodiment, the first insulation layer 20 may include a single-layered silicon oxide layer.

The third insulating layer 30 may cover a portion of the second insulating layer 20 and may extend toward the first to fourth connection parts CP1, CP2, CP3, and CP4. The third insulating layer 30 may be an organic layer and have a single-layered or multilayered structure. For example, the third insulating layer 30 may be a single-layered polyimide-based resin layer. However, the present disclosure is not limited thereto, and the third insulating layer 30 may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. The organic layer to be described later may include at least one of the above-described materials.

The upper electrode UE may be disposed on the second insulating layer 20. The upper electrode UE may overlap the gate GT. The upper electrode UE may be a portion of a metal pattern or a portion of a doped semiconductor pattern. The upper electrode UE overlapping a portion of the gate GT may define a capacitor. In an embodiment of the present disclosure, the upper electrode UE may be omitted.

The fourth insulation layer 40 may be disposed on the second insulation layer 20 to cover the upper electrode UE. The fourth insulation layer 40 may be an inorganic layer.

A fifth insulating layer 50 may be disposed on the fourth insulating layer 40. The fifth insulating layer 50 may be an organic layer and may have a single-layered or multi-layered structure. The fifth insulating layer 50 may extend toward the first to fourth connection parts CP1, CP2, CP3, and CP4.

The first connection electrode CNE1 and the second connection electrode CNE2 may be disposed on the fifth insulating layer 50. Each of the first connection electrode CNE1 and the second connection electrode CNE2 may pass through the insulating layers 10, 20, 40, and 50 and be electrically connected to the first transistor TR-1.

The sixth insulating layer 60 may be disposed on the fifth insulating layer 50 to cover the first connection electrode CNE1 and the second connection electrode CNE2. The sixth insulating layer 60 may be an inorganic layer and may have a single-layered or multi-layered structure.

The seventh insulating layer 70 may be disposed on the sixth insulating layer 60. The seventh insulating layer 70 may be an organic layer. The seventh insulating layer 70 may extend toward the first to fourth connection parts CP1, CP2, CP3, and CP4.

The first light emitting element EML1, the second light emitting element EML2, and the third light emitting element EML3 may be disposed on the seventh insulating layer 70. The first light emitting element EML1 may include a first anode AE1, a first emission layer EL1, and a cathode CE, the second light emitting element EML2 may include a second anode AE2, a second emission layer EL2, and a cathode CE, and the third light emitting element EML3 may include a third anode AE3, a third emission layer EL3, and a cathode CE.

The first anode AE1 may pass through the sixth and seventh insulating layers 60 and 70 and may be electrically connected to the first transistor TR-1. The second anode AE2 may pass through the sixth and seventh insulating layers 60 and 70 and may be electrically connected to the second transistor TR-2. The third anode AE3 may pass through the sixth and seventh insulating layers 60 and 70 and may be electrically connected to the third transistor TR-3.

A pixel defining layer PDL may be disposed on the seventh insulating layer 70. Openings exposing the first to third anodes AE1, AE2, and AE3 may be defined in the pixel defining layer PDL. On the plane, a shape of each of the openings may correspond to the shape of each of the third pixels PAR-3, PAB-3, and PAG-3, which are illustrated in FIG. 7.

The first emission layer EL1 may be disposed on the first anode AE1, and the first emission layer EL1 may provide red light. The second emission layer EL2 may be disposed on the second anode AE2, the second emission layer EL2 may provide blue light. The third emission layer EL3 may be disposed on the third anode AE3, and the third emission layer EL3 may provide green light. Although the patterned first to third emission layers EL1, EL2, and EL3 are illustrated in this embodiment as an example, the present disclosure is not limited thereto. For example, the first to third emission layers EL1, EL2, and EL3 may be connected to each other and commonly disposed in the first to third pixels PAR-1, PAB-1, and PAG-1. In this case, the first to third emission layers EL1, EL2, and EL3 may generate white light or blue light. Also, the first to third emission layers EL1, EL2, and EL3 may have a multilayered structure.

The cathode CE may be disposed on the first to third emission layers EL1, EL2, and EL3. Although not shown, an electronic control layer may be disposed between the cathode CE and the first to third emission layers EL1, EL2, and EL3, and a hole control layer may be disposed between the first to third anodes AE1, AE2, AE3 and the first to third emission layers EL1, EL2, and EL3.

The cover part CP may be disposed on the cathode CE. The cover part CP illustrated in FIG. 9 may correspond to the first cover part, the second cover part, the third cover part, and the fourth cover part, which are described with reference to FIG. 7.

The cover part CP may include a first inorganic layer 110, an organic layer 120, a second inorganic layer 130, a first color filter layer 140, a second color filter layer 150, a third color filter layer 160, and a light blocking layer 170.

The first inorganic layer 110 may be disposed on the cathode CE. The organic layer 120 may be disposed on the first inorganic layer 110. The second inorganic layer 130 may be disposed on the organic layer 120 to cover the organic layer 120. Each of the first inorganic layer 110 and the second inorganic layer 130 may include a silicon nitride layer, a silicon oxynitride layer, a silicon oxide layer, a titanium oxide layer, or an aluminum oxide layer, but are not particularly limited thereto. The organic layer 120 may include an acrylic-based organic layer, but is not particularly limited thereto. The first inorganic layer 110 and the second inorganic layer 130 may protect the first to third emission layers EL1, EL2, and EL3 from moisture/oxygen, and the organic layer 120 may protect the first to third emission layers EL1, EL2, and EL3 from foreign substances such as dust particles.

The first color filter layer 140, the second color filter layer 150, and the third color filter layer 160 may be disposed on the second inorganic layer 130. The second color filter layer 150 may be adjacent to the first color filter layer 140, and the third color filter layer 160 may be adjacent to the second color filter layer 150. On the plane, the first color filter layer 140 may overlap the first anode AE1 and the first emission layer EL1. On the plane, the second color filter layer 150 may overlap the second anode AE2 and the second emission layer EL2. On the plane, the third color filter layer 160 may overlap the third anode AE3 and the third emission layer EL3. The first color filter layer 140 may be a red color filter layer, the second color filter layer 150 may be a blue color filter layer, and the third color filter layer 160 may be a green color filter layer.

In an embodiment of the present disclosure, the light blocking layer 170 may be disposed on the second inorganic layer 130, the first color filter layer 140, the second color filter layer 150, and the third color filter layer 160. First to third openings OP-1, OP-2, and OP-3 may be defined in the light blocking layer 170. The first opening OP-1 may be defined on the first color filter layer 140, the second opening OP-2 may be defined on the second color filter layer 150, and the third opening OP-3 may be defined on the third color filter layer 160.

In an embodiment of the present disclosure, the light blocking layer 170 may be disposed on the second inorganic layer 130. The first color filter layer 140, the second color filter layer 150, and the third color filter layer 160 may be disposed on the first opening OP-1, the second opening OP-2, and the third opening OP-3, respectively.

A first sensing line pattern SEL1 may be disposed on the light blocking layer 170. The first sensing line pattern SEL1 may be disposed on a first boundary BD1 between the first color filter layer 140 and the second color filter layer 150 and a second boundary BD2 between the second color filter layer 150 and the third color filter layer 160.

In an embodiment of the present disclosure, the sensing insulating layer ILS (see FIG. 6A) may be further disposed. For example, when the input sensing layer ISL (see FIG. 6A) has the laminated structure illustrated in FIGS. 6A and 6B, the sensing insulating layer ILS may be disposed under the first sensing line pattern SEL1. When the input sensing layer ISL (see FIG. 6C) has the laminated structure as illustrated in FIG. 6C, the sensing insulating layer ILS may be disposed on the first sensing line pattern SEL1.

Figure 10:
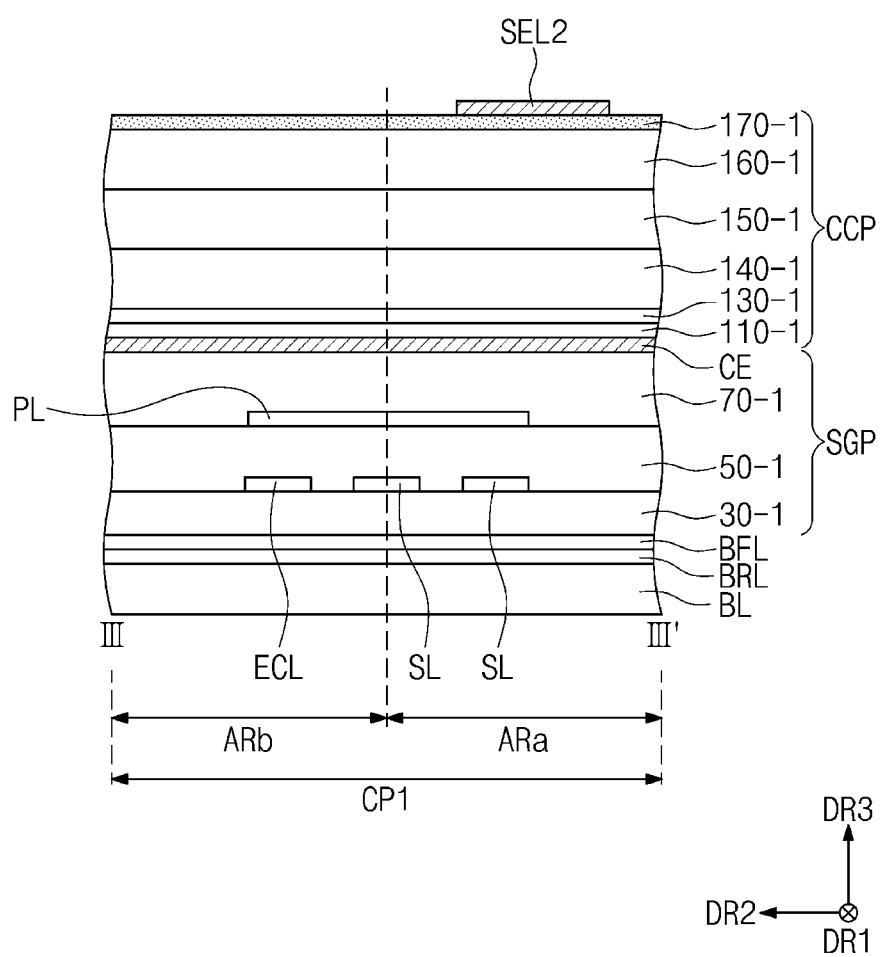
FIG. 10 is a cross-sectional view taken along line III-III' of FIG. 7.

When a distance between the first sensing line pattern SEL1 and the cathode CE is less than a predetermined distance, a size of a parasitic cap generated between the first sensing line pattern SEL1 and the cathode CE increases. In this case, touch sensitivity and accuracy may be reduced by the parasitic cap. According to an embodiment of the present disclosure, a gap between the first sensing line pattern SEL1 and the cathode CE may be maintained to a predetermined distance or more by the cover part CP. That is, even if the input sensing layer ISL (see FIG. 3) is directly disposed on the display panel DP (see FIG. 3) in the display device DD (see FIG. 1), the distance between the first sensing line pattern SEL1 and the cathode CE may be maintained to the predetermined distance or more by the cover part CP to improve the touch sensitivity and the accuracy. The predetermined distance may be 4 micrometers or more and may be 7 micrometers or more depending on characteristics of a material or the like. FIG. 10 is a cross-sectional view taken along line III-III' of FIG. 7. FIG. 10 is a cross-sectional view of an area including the first connection part CP1.

Referring to FIGS. 7, 9, and 10, a barrier layer BRL, a buffer layer BFL, a line part SGP, a connection cover part CCP, and a second sensing line pattern SEL2 may be sequentially disposed on the first connection part CP1 of the base layer BL.

The line part SGP may include a plurality of insulating layers 30-1, 50-1 and 70-1 and signal lines SL, ECL, and PL.

The first insulating layer 30-1 may be disposed on the buffer layer BFL. The first insulating layer 30-1 may be an organic layer and may have a single-layered or multi-layered structure. The first insulating layer 30-1 may be a layer connected to the third insulating layer 30 described above with reference to FIG. 9. That is, the third insulating layer 30 may extend over the first connection part CP1 to constitute the first insulating layer 30-1.

At least some of the signal lines SL, ECL, and PL may be disposed on the first insulating layer 30-1. For example, the scan lines SL and the emission control line ECL may be disposed on the first insulating layer 30-1.

The second insulating layer 50-1 may be disposed on the first insulating layer 30-1 to cover the scan lines SL and the emission control line ECL. The second insulating layer 50-1 may be an organic layer and may have a single-layered or multi-layered structure. The second insulating layer 50-1 may be a layer connected to the fifth insulating layer 50 described above with reference to FIG. 9.

Other portions of the signal lines SL, ECL, and PL may be disposed on the second insulating layer 50-1. For example, the power line PL may be disposed on the second insulating layer 50-1.

The third insulating layer 70-1 may be disposed on the second insulating layer 50-1 to cover the power line PL. The third insulating layer 70-1 may be an organic layer and may have a single-layered or multi-layered structure. The third insulating layer 70-1 may be a layer connected to the seventh insulating layer 70 described above with reference to FIG. 9.

The cathode CE may be disposed on the third insulating layer 70-1.

The connection cover part CCP may be disposed on the cathode CE. The connection cover part CCP illustrated in FIG. 10 may correspond to the first connection cover part, the second connection cover part, the third connection cover part, and the fourth connection cover part, which are described with reference to FIG. 7.

The connection cover part CCP may include a first connection inorganic layer 110-1, a second connection inorganic layer 130-1, a first compensation layer 140-1, a second compensation layer 150-1, a third compensation layer 160-1, and a connection light blocking layer 170-1.

The first connection inorganic layer 110-1 may be disposed on the cathode CE. The first connection inorganic layer 110-1 may extend from the first inorganic layer 110.

The second connection inorganic layer 130-1 may be disposed on the first connection inorganic layer 110-1. The second connection inorganic layer 130-1 may extend from the second inorganic layer 130.

The first compensation layer 140-1 may be disposed on the second connection inorganic layer 130-1. The first compensation layer 140-1 may include the same material as the first color filter layer 140 and be formed through the same process as the first color filter layer 140.

The second compensation layer 150-1 may be disposed on the first compensation layer 140-1. The second compensation layer 150-1 may include the same material as the second color filter layer 150 and be formed through the same process as the second color filter layer 150.

The third compensation layer 160-1 may be disposed on the second compensation layer 150-1. The third compensation layer 160-1 may include the same material as the third color filter layer 160 and be formed through the same process as the third color filter layer 160.

The connection light blocking layer 170-1 may be disposed on the third compensation layer 160-1. The connection light blocking layer 170-1 may extend from the light blocking layer 170.

The second sensing line pattern SEL2 may be disposed on the connection light blocking layer 170-1. The second sensing line pattern SEL2 may be disposed on the first area ARa to overlap the first area ARa on the plane. Also, the second sensing line pattern SEL2 may not overlap the second area ARb on the plane. For example, the second sensing line pattern SEL2 may be spaced apart from the second area ARb on the plane.

When the shape of the display device DD (see FIG. 1A) is modified, tensile stress generated in the second area ARb may be greater than that generated in the first area ARa. The tensile stress can cause cracks or breakages in the line. According to an embodiment of the present disclosure, since the second sensing line pattern SEL2 is disposed on the first area ARa, possibility that the second sensing line pattern SEL2 is cracked and possibility that the second sensing line pattern SEL2 is disconnected may be reduced.

According to an embodiment of the present disclosure, since a distance between the second sensing line pattern SEL2 and the cathode CE is maintained to a predetermined distance or more by the connection cover part CCP, the touch sensitivity and the accuracy may be improved.

The first sensing line pattern SEL1 and the second sensing line pattern SEL2 may be connected to each other. According to an embodiment of the present disclosure, a height difference between a top surface of the connection cover part CCP and a top surface of the cover part CP may be reduced. Thus, the possibility that the first sensing line pattern SEL1 and the second sensing line pattern SEL2 are disconnected may be reduced.

In an embodiment of the present disclosure, some components of the connection cover part CCP may be omitted. For example, at least one or more of the first compensation layer 140-1, the second compensation layer 150-1, the third compensation layer 160-1, and the connection light blocking layer 170-1 of the connection cover part CCP may be omitted.

Figure 11:
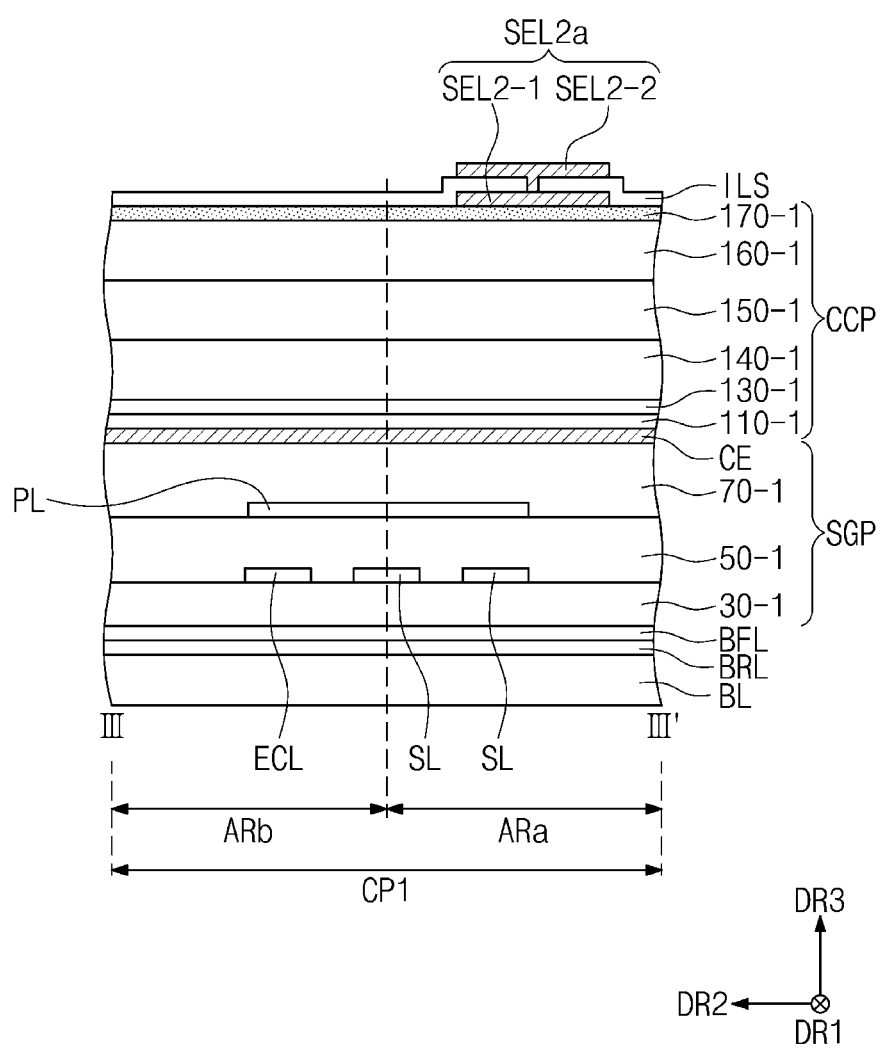
FIG. 11 is a cross-sectional view taken along line III-III' of FIG. 7.

FIG. 11 is a cross-sectional view taken along line III-III' of FIG. 7. In FIG. 11, portions different from those of FIG.

10 will be described, and the same reference numerals will be used for the same components as those of FIG. 11, and thus, descriptions thereof will be omitted.

Referring to FIG. 11, the second sensing line pattern SEL2a may include a first sub sensing layer SEL2-1 and a second sub sensing layer SEL2-2. The second sub sensing layer SEL2-2 may be disposed on a different layer from the first sub sensing layer SEL2-1, and the second sub sensing layer SEL2-2 may be electrically connected to the first sub sensing layer SEL2-1.

As the shape of the display device DD (see FIG. 1A) is modified, stress may be applied to the first to fourth connection parts CP1, CP2, CP3, and CP4. According to an embodiment of the present disclosure, the second sensing line pattern SEL2a may be provided to have a laminated structure including a plurality of conductive layers. In this case, even if the disconnection occurs in one of the two layers, an electrical signal may be transmitted to the other layer to improve product reliability.

Figure 12:
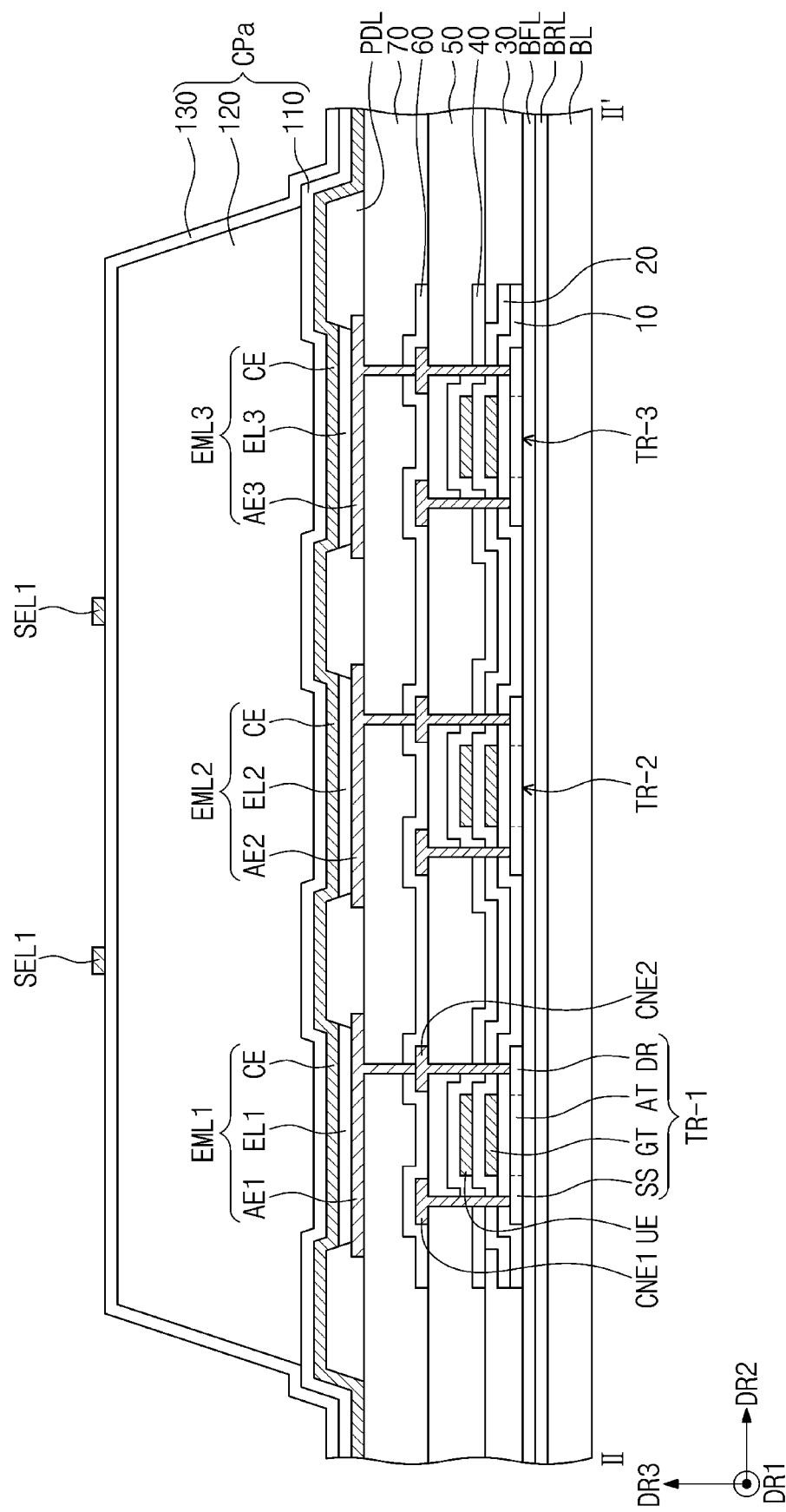
FIG. 12 is a cross-sectional view taken along line II-II' of FIG. 7.

FIG. 12 is a cross-sectional view taken along line II-II' of FIG. 7. In FIG. 12, portions different from those of FIG. 9 will be described, and the same reference numerals will be used for the same components as those of FIG. 9, and thus, descriptions thereof will be omitted.

Referring to FIG. 12, the cover part CPa may be disposed on the cathode CE. The cover part CPa may include a first inorganic layer 110, an organic layer 120, and a second inorganic layer 130.

The first inorganic layer 110 may be disposed on the cathode CE. The first inorganic layer 110 may be disposed on the organic layer 120. The second inorganic layer 130 may be disposed on the organic layer 120 to cover the organic layer 120.

The first sensing line pattern SEL1 may be disposed on the second inorganic layer 130. On the plane, the first sensing line pattern SEL1 may overlap the pixel defining layer PDL. A gap between the first sensing line pattern SEL1 and the cathode CE may be maintained to a predetermined distance or more by the organic layer 120. The predetermined distance may be 4 micrometers or more and 7 micrometers or less. However, the predetermined distance is not limited to the illustrative value. That is, even if the input sensing layer ISL (see FIG. 3) is directly disposed on the display panel DP (see FIG. 3) in the display device DD (see FIG. 1), the distance between the first sensing line pattern SEL1 and the cathode CE may be maintained to the predetermined distance or more by the cover part CPa to improve the touch sensitivity and the accuracy.

Figure 13:
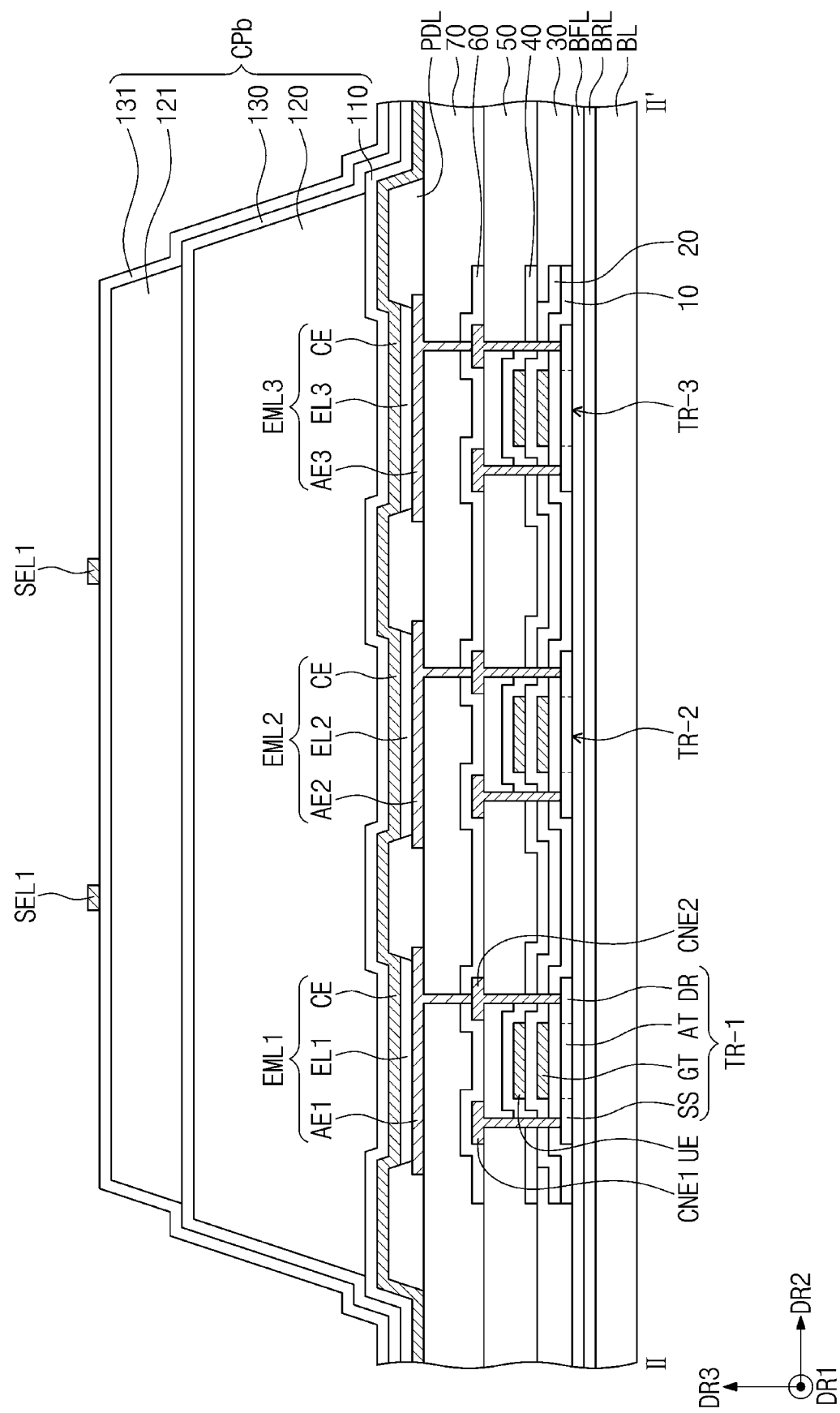
FIG. 13 is a cross-sectional view taken along line II-II' of FIG. 7.

FIG. 13 is a cross-sectional view taken along line II-II' of FIG. 7. In FIG. 13, portions different from those of FIG. 9 will be described, and the same reference numerals will be used for the same components as those of FIG. 9, and thus, descriptions thereof will be omitted.

Referring to FIG. 13, the cover part CPb may be disposed on the cathode CE. The cover part CPb may include a first inorganic layer 110, a first organic layer 120, a second inorganic layer 130, a second organic layer 121, and a third inorganic layer 131.

The first inorganic layer 110 may be disposed on the cathode CE. The first organic layer 120 may be disposed on the first inorganic layer 110. The second inorganic layer 130 may be disposed on the first organic layer 120 to cover the first organic layer 120. The second organic layer 121 may be disposed on the second inorganic layer 130. The third inorganic layer 131 may be disposed on the second organic layer 121 to cover the second organic layer 121.

The first sensing line pattern SEL1 may be disposed on the third inorganic layer 131. On the plane, the first sensing line pattern SEL1 may overlap the pixel defining layer PDL. A gap between the first sensing line pattern SEL1 and the cathode CE may be maintained to a predetermined distance or more by the first organic layer 120 and the second organic layer 121. The predetermined distance may be 4 micrometers or more and 7 micrometers or less. However, the predetermined distance is not limited to the illustrative value.

Figure 14:
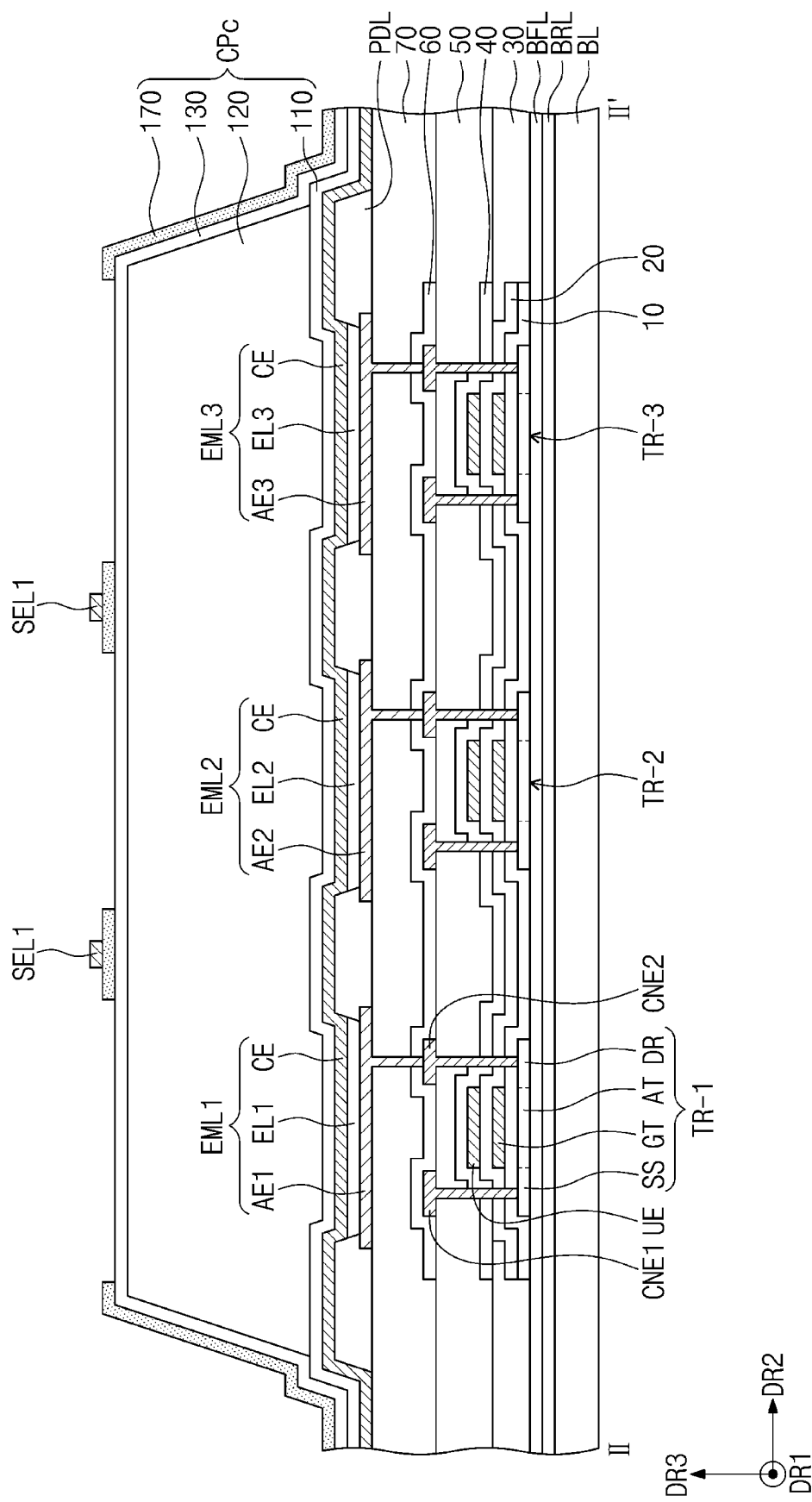
FIG. 14 is a cross-sectional view taken along line II-II' of FIG. 7.

FIG. 14 is a cross-sectional view taken along line II-II' of FIG. 7. In FIG. 14, portions different from those of FIGS. 9 and 12 will be described, and the same reference numerals will be used for the same components as those of FIGS. 9 and 12, and thus, descriptions thereof will be omitted.

Referring to FIG. 14, the cover part CPc may be disposed on the cathode CE. The cover part CPc may include a first inorganic layer 110, an organic layer 120, a second inorganic layer 130, and a light blocking layer 170. The first sensing line pattern SEL1 may be disposed on the light blocking layer 170.

Figure 15:
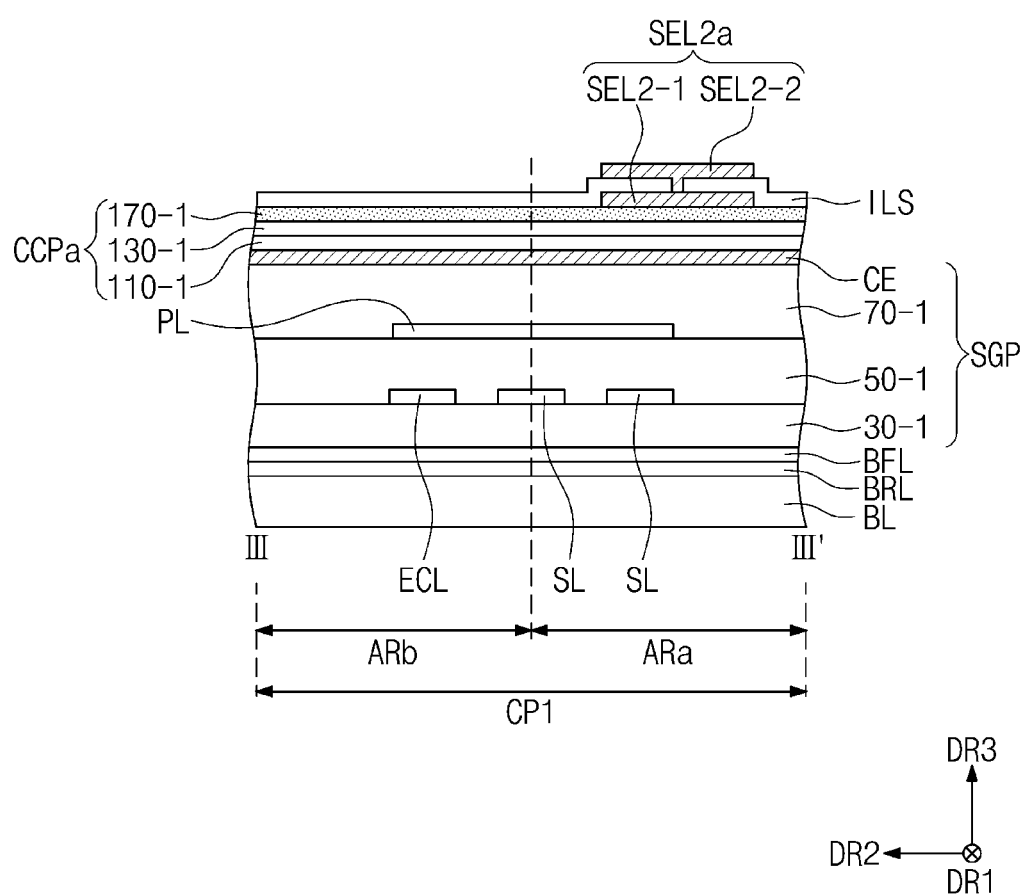
FIG. 15 is a cross-sectional view taken along line III-III' of FIG. 7.

FIG. 15 is a cross-sectional view taken along line III-III' of FIG. 7. In FIG. 15, portions different from those of FIG. 11 will be described, and the same reference numerals will be used for the same components as those of FIG. 11, and thus, descriptions thereof will be omitted.

Referring to FIG. 15, the connection cover part CCPa may be disposed on the cathode CE. The connection cover part CCP may include a first connection inorganic layer 110-1, a second connection inorganic layer 130-1, and a connection light blocking layer 170-1.

The first connection inorganic layer 110-1 may be disposed on the cathode CE. The first connection inorganic layer 110-1 may extend from the first inorganic layer 110 (see FIG. 14). The second connection inorganic layer 130-1 may be disposed on the first connection inorganic layer 110-1. The second connection inorganic layer 130-1 may extend from the second inorganic layer 130 (see FIG. 14). The connection light blocking layer 170-1 may be disposed on the second connection inorganic layer 130-1. The connection light blocking layer 170-1 may extend from the light blocking layer 170 (see FIG. 14). The second sensing line pattern SEL2a may be disposed on the connection light blocking layer 170-1.

The first cover parts CP1a, CP1b, and CP1c described with reference to FIGS. 12 to 14 may not include the color filter layers 140, 150, and 160 (see FIG. 9). In this case, the connection cover part CCPa may not include the first to third compensation layers 140-1, 150-1, and 160-1 (see FIG. 10).

Figure 16:
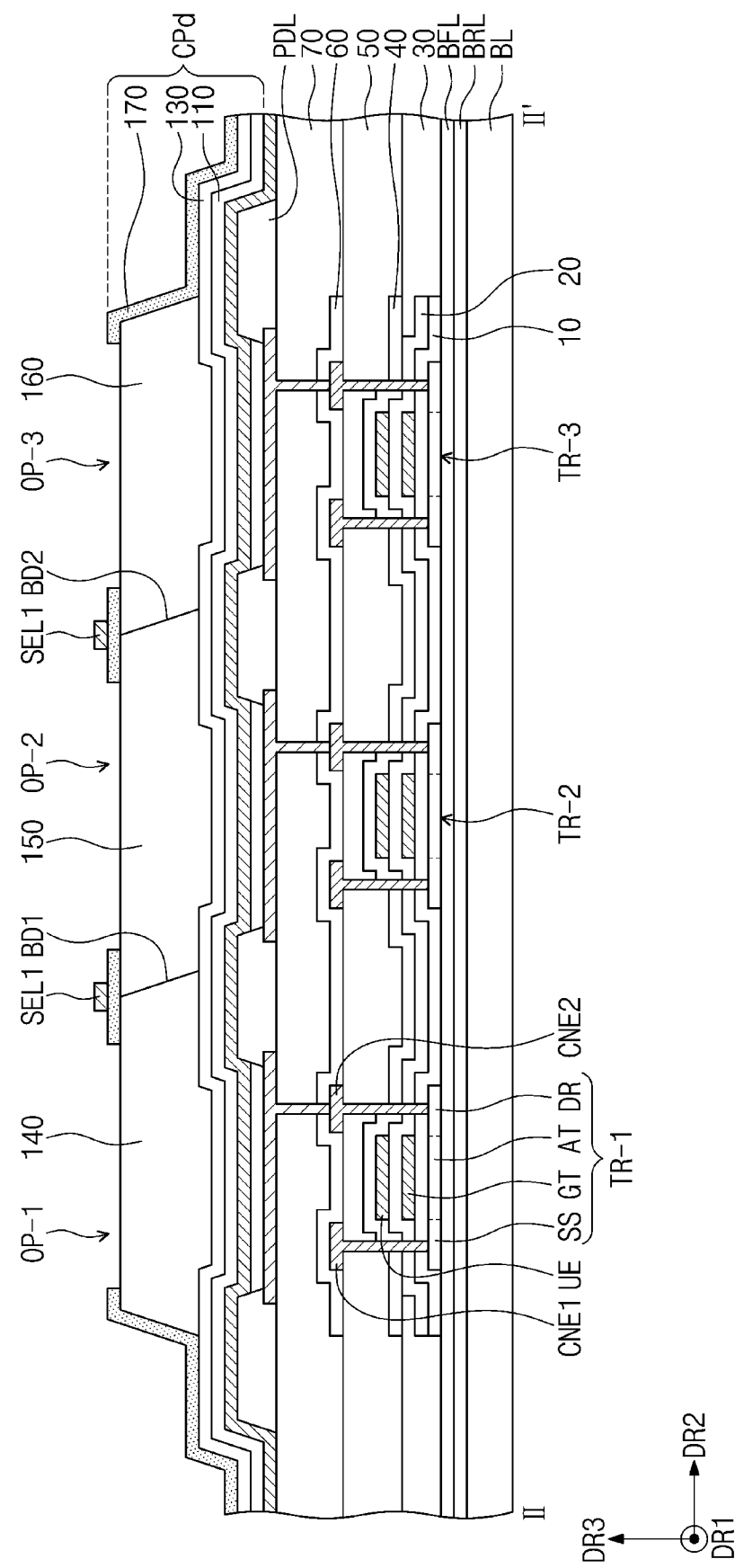
FIG. 16 is a cross-sectional view taken along line II-II' of FIG. 7.

FIG. 16 is a cross-sectional view taken along line II-II' of FIG. 7. In FIG. 16, portions different from those of FIG. 9 will be described, and the same reference numerals will be used for the same components as those of FIG. 9, and thus, descriptions thereof will be omitted.

Referring to FIG. 16, the cover part CPd may be disposed on the cathode CE. The cover part CPd may include a first inorganic layer 110, a second inorganic layer 130, a first color filter layer 140, a second color filter layer 150, a third color filter layer 160, and a light blocking layer 170.

The first inorganic layer 110 may be disposed on the cathode CE. The second inorganic layer 130 may be disposed on the first inorganic layer 110. The first color filter layer 140, the second color filter layer 150, and the third color filter layer 160 may be disposed on the second inorganic layer 130. The light blocking layer 170 may cover the first color filter layer 140, the second color filter layer 150, and the third color filter layer 160, and first to third openings OP-1, OP-2, and OP-3 may be defined in the light blocking layer 170.

The first sensing line pattern SEL1 may be disposed on the light blocking layer 170. On the plane, the first sensing line pattern SEL1 may overlap the pixel defining layer PDL. A gap between the first sensing line pattern SEL1 and the cathode CE may be a maintained to a predetermined distance or more by the first to third color filter layers 140, 150, and 160.

Figure 17:
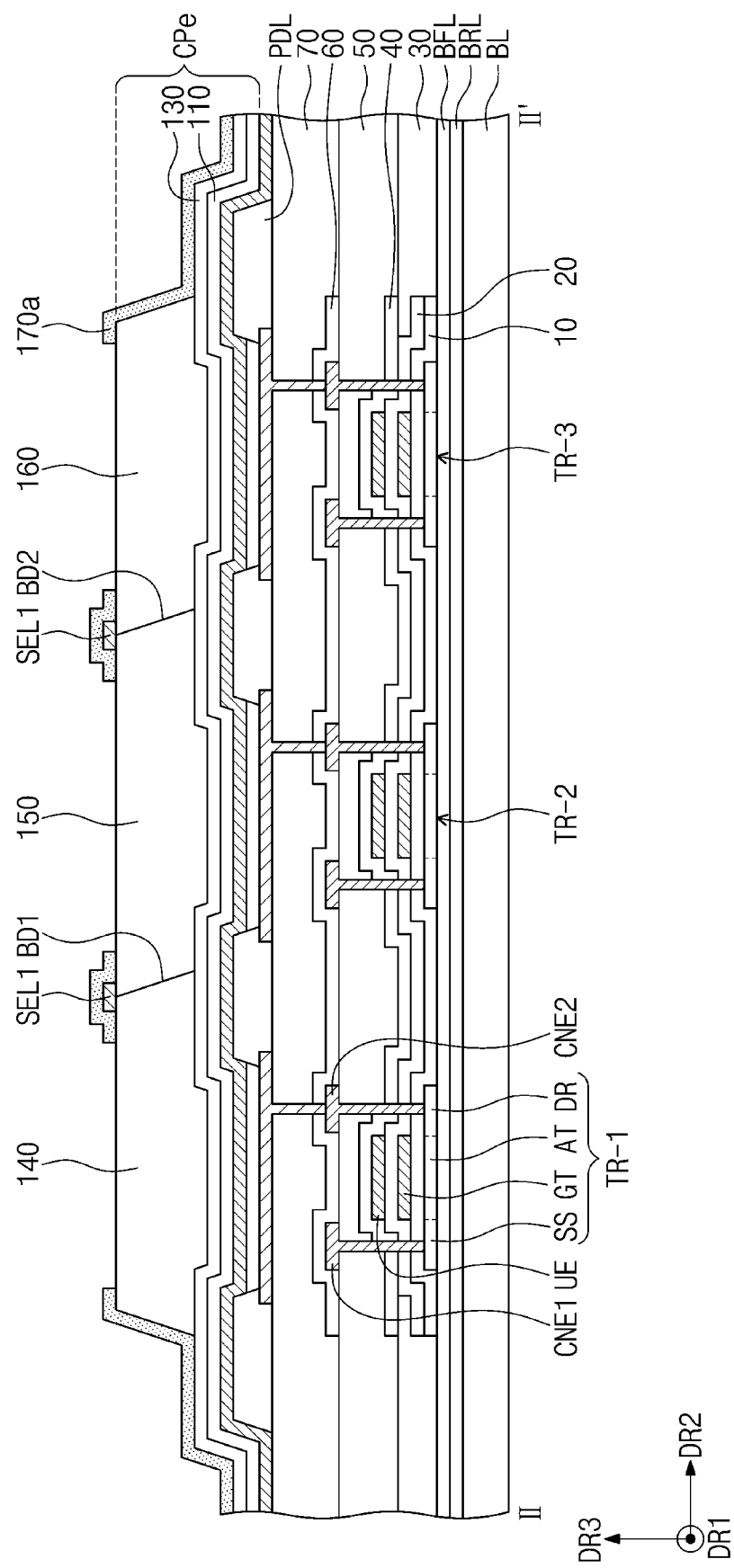
FIG. 17 is a cross-sectional view taken along line II-II' of FIG. 7.

FIG. 17 is a cross-sectional view taken along line II-II' of FIG. 7. In FIG. 17, portions different from those of FIG. 16 will be described, and the same reference numerals will be used for the same components as those of FIG. 16, and thus, descriptions thereof will be omitted.

Referring to FIG. 17, a cover part CPe may not include the light blocking layer 170 (see FIG. 16) when compared to the cover part CPd of FIG. 16. Thus, the first sensing line pattern SEL1 may be disposed on the first to third color filter layers 140, 150, and 160.

A light blocking layer 170a covering the first sensing line pattern SEL1 may be disposed on the first sensing line pattern SEL1. Thus, a phenomenon in which light incident from the outside is reflected by the first sensing line pattern SEL1 may be prevented.

Figure 18:
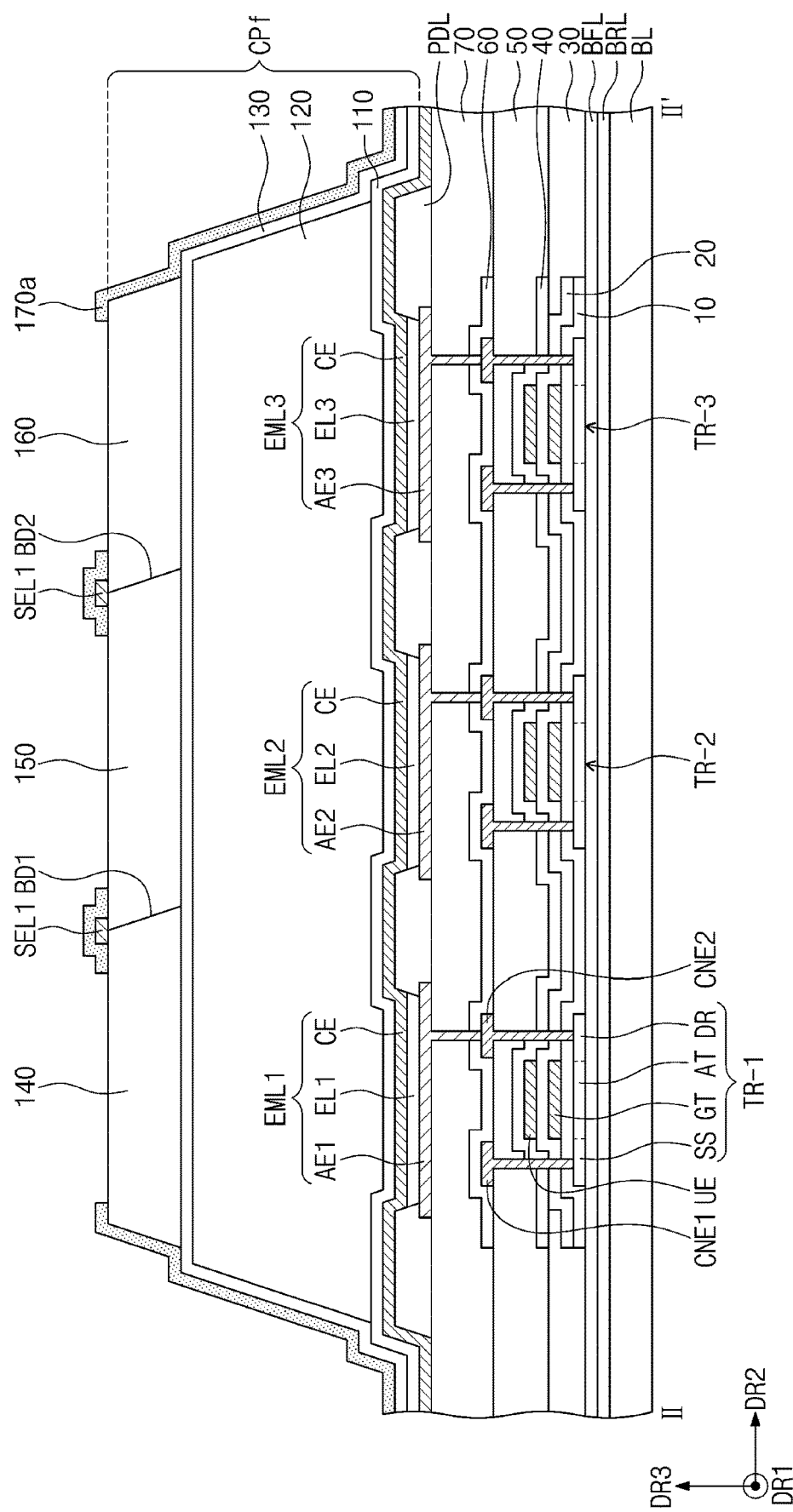
FIG. 18 is a cross-sectional view taken along line II-II' of FIG. 7.

FIG. 18 is a cross-sectional view taken along line II-II' of FIG. 7. In FIG. 18, portions different from those of FIG. 9 will be described, and the same reference numerals will be used for the same components as those of FIG. 9, and thus, descriptions thereof will be omitted.

Referring to FIG. 18, a cover part CPf may not include the light blocking layer 170a (see FIG. 16) when compared to the cover part CP of FIG. 9. Thus, the first sensing line pattern SEL1 may be disposed on the first to third color filter layers 140, 150, and 160.

A light blocking layer 170a covering the first sensing line pattern SEL1 may be disposed on the first sensing line pattern SEL1. Thus, a phenomenon in which light incident from the outside is reflected by the first sensing line pattern SEL1 may be prevented.

Figure 19:
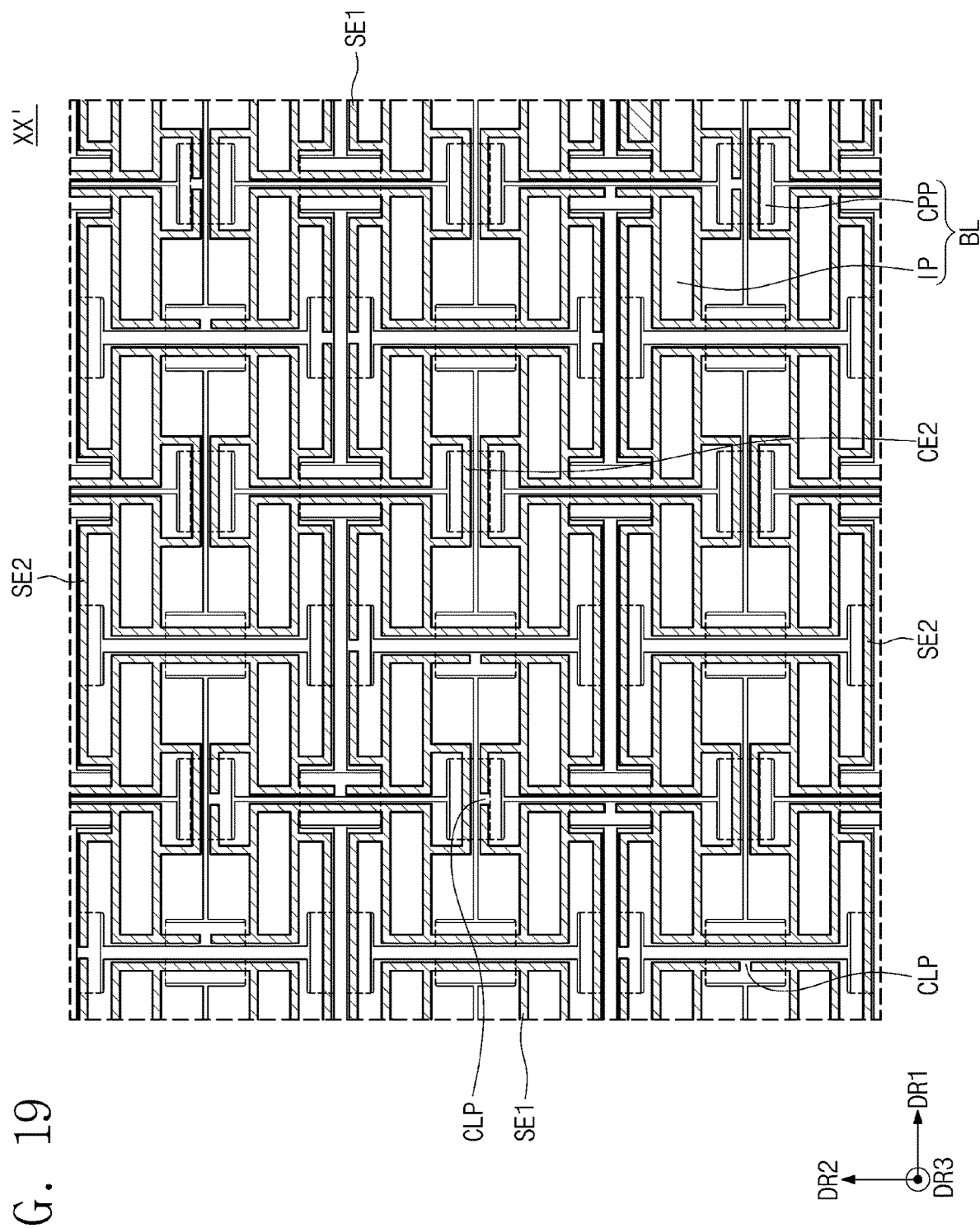
FIG. 19 is a plan view illustrating an area corresponding to an area XX' of FIG. 5.

FIG. 19 is a plan view illustrating a portion of components disposed on an area corresponding to an area XX' of FIG. 5.

In FIG. 19, only the base layer BL, the first sensing pattern SE1, the second sensing pattern SE2, and the second connection pattern CE2 are illustrated.

The base layer BL may include island parts IP and connection parts CPP. When the shape of the display panel DP (see FIG. 3) is modified, a distance between the adjacent connection parts CPP may increase.

The first sensing pattern SE1, the second sensing pattern SE2, and the second connection pattern CE2 may be disposed on the same layer. Also, the first sensing pattern SE1, the second sensing pattern SE2, and the second connection pattern CE2 may include the same material and be formed through the same process. The first connection pattern CE1 (see FIG. 5) may be disposed on a different layer from the first sensing pattern SE1, the second sensing pattern SE2, and the second connection pattern CE2. The second sensing pattern SE2 and the second connection pattern CE2 are connected to each other and thus may have an integrated shape. The first sensing pattern SE1 may be spaced apart from the second sensing pattern SE2 and the second connection pattern CE2.

Disconnection parts CLP may be defined between the first sensing pattern SE1 and the second sensing pattern SE2 and between the first sensing pattern SE1 and the second connection pattern CE2. The disconnection parts CLP may be provided by removing a portion of a metal pattern constituting the first sensing pattern SE1, the second sensing pattern SE2, and the second connection pattern CE2.

In an embodiment of the present disclosure, positions of the disconnected parts CLP may be defined above the disconnected parts CLP. However, the present disclosure is not limited thereto, and the disconnection parts CLP may be disposed on the island parts IP. Also, in an embodiment of the present disclosure, a portion of the disconnected parts CLP may be defined on the island parts IP, and the other portion of the disconnected parts CLP may be defined on the connection parts CPP.

Each of the connection parts CPP may be a region of which a shape is modified to correspond to the shape modification of the display panel DP (see FIG. 3). When the disconnected parts CLP are defined above the connection parts CPP, a width of each of the disconnected parts CLP may increase or decrease as the shape of the connection parts CPP is modified. That is, a distance between two patterns facing each other with the disconnection parts CLP therebetween may be changed.

A distance between the first sensing pattern SE1 and the second connection pattern CE2, which face each other, and a distance between the first sensing pattern SE1 and the second sensing pattern SE2, which face each other, may be changed corresponding to the modification in shape of the connection parts CPP. Thus, a degree of the modification in shape of the first sensing pattern SE1, the second sensing pattern SE2, and the second connection pattern CE2 itself may be reduced corresponding to the modification in shape of the connection parts CPP. As a result, the stress applied to the first sensing pattern SE1, the second sensing pattern SE2, and the second connection pattern CE2 may be reduced.

It will be apparent to those skilled in the art that various modifications and deviations can be made in the present disclosure. Thus, it is intended that the present disclosure covers the modifications and deviations of this disclosure provided they come within the scope of the present disclosure. Accordingly, the technical scope of the present disclosure should not necessarily be limited to the contents described in the detailed description of the specification.

The invention claimed is:

1. A display device, comprising:
   a display panel configured to display an image; and
   an input sensing layer comprising sensing patterns and connection patterns,
   wherein the display panel comprises:
      a base layer comprising a first island part, a second island part spaced apart from the first island part, and a connection part connecting the first island part to the second island part and having a shape extending in a first direction;
      a first pixel disposed on the first island part;
      a second pixel disposed on the second island part;
      signal lines disposed on the connection part and electrically connected to each of the first pixel and the second pixel,
      a first cover part covering the first pixel;
      a second cover part covering the second pixel; and
      a connection cover part disposed on the signal lines,
   wherein each of the sensing patterns comprises a first sensing line pattern disposed on both the first cover part and the second cover part, and a second sensing line pattern disposed on the connection cover part, and
   wherein the connection part comprises a first area and a second area, each of which has a shape extending in the first direction and which are adjacent to each other in a second direction crossing the first direction, wherein the first area is spaced apart from both the first island part and the second island part with the second area interposed therebetween, and the second sensing line pattern is disposed on the first area.

2. The display device of claim 1, wherein each of the first cover part and the second cover part comprises:
a first inorganic layer;
an organic layer disposed on the first inorganic layer; and
a second inorganic layer covering the organic layer,
wherein the first sensing line pattern is disposed on the second inorganic layer.

3. The display device of claim 2, wherein each of the first cover part and the second cover part further comprises a light blocking layer disposed between the second inorganic layer and the first sensing line pattern.

4. The display device of claim 3, wherein the connection cover part comprises:
a first connection inorganic layer extending from the first inorganic layer; and
a second connection inorganic layer extending from the second inorganic layer and disposed on the first connection inorganic layer.

5. The display device of claim 4, wherein the connection cover part further comprises a connection light blocking layer disposed on the second connection inorganic layer and extending from the light blocking layer.

6. The display device of claim 2, wherein each of the first cover part and the second cover part further comprises:
a first color filter layer disposed on the second inorganic layer;
a second color filter layer disposed on the second inorganic layer, adjacent to the first color filter layer; and
a third color filter layer disposed on the second inorganic layer, adjacent to the second color filter layer,
wherein the first sensing line pattern is disposed on each of the first color filter layer, the second color filter layer, and the third color filter layer.

7. The display device of claim 6, wherein the connection cover part comprises:
a first compensation layer comprising a same material as the first color filter layer;
a second compensation layer comprising a same material as the second color filter layer; and
a third compensation layer comprising a same material as the third color filter layer,
wherein the second sensing line pattern is disposed on the third compensation layer.

8. The display device of claim 7, wherein the connection cover part further comprises a light blocking layer disposed between the third compensation layer and the second sensing line pattern.

9. The display device of claim 6, wherein each of the first cover part and the second cover part further comprises a light blocking layer disposed between the first sensing line pattern and the first to third color filter layers,
wherein openings are defined in the light blocking layer.

10. The display device of claim 6, wherein each of the first cover part and the second cover part further comprises a light blocking layer covering the first sensing line pattern.

11. The display device of claim 1, wherein each of the first cover part and the second cover part comprises:
a first inorganic layer;
a second inorganic layer disposed directly on the first inorganic layer;
a first color filter layer disposed on the second inorganic layer;
a second color filter layer disposed on the second inorganic layer, adjacent to the first color filter layer; and
a third color filter layer disposed on the second inorganic layer, adjacent to the second color filter layer,
wherein the first sensing line pattern is disposed on each of the first color filter layer, the second color filter layer, and the third color filter layer.

12. The display device of claim 11, wherein each of the first cover part and the second cover part further comprises a light blocking layer disposed between the first sensing line pattern and the first to third color filter layers.

13. The display device of claim 11, wherein each of the first cover part and the second cover part further comprises a light blocking layer covering the first sensing line pattern.

14. The display device of claim 1, wherein each of the first cover part and the second cover part comprises:
a first inorganic layer;
a first organic layer disposed on the first inorganic layer;
a second inorganic layer disposed on the first organic layer;
a second organic layer disposed on the second inorganic layer; and
a third inorganic layer covering the second organic layer,
wherein the first sensing line pattern is disposed on the third inorganic layer.

15. The display device of claim 1, wherein the second sensing line pattern comprises:
a first sub sensing layer connected to the first sensing line pattern; and
a second sub sensing layer disposed on a different layer from the first sub sensing layer,
wherein the first sub sensing layer and the second sub sensing layer are electrically connected to each other.

16. The display device of claim 15, wherein the sensing patterns comprise first sensing patterns and second sensing patterns,
wherein the connection patterns comprise a first connection pattern connected to the first sensing patterns adjacent to each other and a second connection pattern connected to the second sensing patterns adjacent to each other, and
wherein the input sensing layer further comprises a sensing insulating layer disposed between the first connection pattern and the second connection pattern.

17. The display device of claim 16, wherein the first sub sensing layer comprises a same material as the first connection pattern,
wherein the second sub sensing layer comprises a same material as the second connection pattern, and
wherein the sensing insulating layer extends to an area between the first sub sensing layer and the second sub sensing layer.

18. The display device of claim 1, wherein the input sensing layer further comprises a light absorption layer disposed on at least a portion of the sensing patterns and the connection patterns.

19. A display device, comprising:
a display panel configured to display an image; and
an input sensing layer and comprising sensing patterns and connection patterns,
wherein the display panel comprises:
a base layer comprising a first island part, a second island part, and a connection part connecting the first island part to the second island part;
a first pixel disposed on the first island part;
a second pixel disposed on the second island part;

signal lines disposed on the connection part and electrically connected to each of the first pixel and the second pixel;

a first cover part disposed on the first pixel and covering the first pixel;

a second cover part disposed on the second pixel and covering the second pixel; and a connection cover part disposed on the signal lines, wherein each of the sensing patterns comprises a first sensing line pattern disposed on the first cover part and the second cover part and a second sensing line pattern disposed on the connection cover part and connected to the first sensing line pattern, wherein each of the first cover part and the second cover part comprises a color filter layer, wherein the connection cover part comprises a compensation layer, and wherein the compensation layer comprises a same material as the color filter layer.

20. The display device of claim 19, wherein the connection part has a shape extending from the first island part to the second island part in a first direction, wherein the connection part comprises a first area and a second area, each of which has a shape extending in the first direction, wherein the first area is spaced apart from the first island part and the second island part with the second area interposed therebetween in a second direction crossing the first direction, and wherein the second sensing line pattern overlaps the first area on a plane and is spaced apart from the second area.

* * * * *